United States Patent
Mizuno et al.

(10) Patent No.: US 7,800,667 B2
(45) Date of Patent: Sep. 21, 2010

(54) PHOTO-DETECTING APPARATUS

(75) Inventors: Seiichiro Mizuno, Hamamatsu (JP); Yukinobu Sugiyama, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 830 days.

(21) Appl. No.: 10/574,104

(22) PCT Filed: Sep. 27, 2004

(86) PCT No.: PCT/JP2004/014091

§ 371 (c)(1),
(2), (4) Date: Apr. 13, 2007

(87) PCT Pub. No.: WO2005/034511

PCT Pub. Date: Apr. 14, 2005

(65) Prior Publication Data

US 2008/0036887 A1    Feb. 14, 2008

(30) Foreign Application Priority Data

Oct. 2, 2003   (JP) .............................. 2003-344895

(51) Int. Cl.
  *H04N 3/14* (2006.01)
  *H04N 5/335* (2006.01)
(52) U.S. Cl. ................. 348/294; 348/300; 348/301; 348/302; 348/307; 348/312
(58) Field of Classification Search ................. 348/294, 348/300, 301, 302, 307, 312; 250/208.1; 257/291, 292, 290
See application file for complete search history.

(56) References Cited

U.S. PATENT DOCUMENTS 7,268,815 B1 *  9/2007  Meynants ................. 348/294
7,286,174 B1 * 10/2007  Weale et al. ............. 348/308
7,456,887 B2 * 11/2008  Zhao et al. ............... 348/308

FOREIGN PATENT DOCUMENTS

JP            63-254765         10/1988

(Continued)

*Primary Examiner*—Yogesh K Aggarwal
(74) *Attorney, Agent, or Firm*—Drinker Biddle & Reath LLP

(57) ABSTRACT

The present invention relates to a photo-detecting apparatus having a structure for enabling photodetection with high sensitivity and wide dynamic range. When light is incident on a pixel section of an active pixel-type within a photo-detecting section, a voltage value corresponding to the amount of an electric charge generated at a photodiode included in the pixel section is outputted from the pixel section by way of a selecting transistor. A first pixel data readout section outputs the output from the pixel section as a first voltage value. On the other hand, the electric charge generated at the photodiode including the pixel section is outputted from the pixel section by way of a discharging transistor. The electric charge flown in a second pixel data readout section via a switch is accumulated in a capacitive element, and a voltage value corresponding to the amount of the accumulated electric charge is outputted from the second pixel data readout section as a second voltage value. The capacitance value of the capacitive element within the second pixel data readout section is greater than that of the parasitic capacitance section included in the pixel section.

33 Claims, 17 Drawing Sheets

FOREIGN PATENT DOCUMENTS

| | | |
|---|---|---|
| JP | 8-149376 | 6/1996 |
| JP | 9-55888 | 2/1997 |
| JP | 10-93868 | 4/1998 |
| JP | 11-214738 | 8/1999 |
| JP | 11-274454 | 10/1999 |
| JP | 2000-23044 | 1/2000 |
| JP | 2000-165754 | 6/2000 |
| JP | 2002-77733 | 3/2002 |
| JP | 2002-77737 | 3/2002 |
| JP | 2003-134396 | 5/2003 |

* cited by examiner

PHOTO-DETECTING APPARATUS

TECHNICAL FIELD

The present invention relates to a photo-detecting apparatus having a pixel section of an active-pixel type including a photodiode.

BACKGROUND ART

A photo-detecting apparatus using CMOS technology is known; especially, the one of an active-pixel type system is known (see Patent Reference 1). The photo-detecting apparatus of the active-pixel system has a picture element or pixel section of an active-pixel type including a photodiode for generating the amount of an electric charge corresponding to intensity of incident light, and converts the electric charge generated at the photodiode into a voltage, namely carries out charge-to-voltage conversion by way of a source follower circuit constituting transistors, which enables photodetection with high sensitivity and low noise.

An output voltage value V is represented by the following equation: $V=Q/C_f$, where $C_f$ is the capacitance value of the parasitic capacitance section that stores the electric charge generated at the photodiode, and Q is the amount of the electric charge. As is apparent from this equation, when the capacitance value $C_f$ is decreased, sensitivity of the photodetection can be enhanced.

On the other hand, an upper limit of the output voltage value V is a level of several voltages due to the range of an applicable voltage of a power source and circuit-based restrictions. Thus, there is also an upper limit in the amount Q of the electric charge that can be accumulated in the parasitic capacitance section.

Provided that the upper limit of the amount Q of the electric charge that can be accumulated in the parasitic capacitance section (the amount of saturated electric charge) is enhanced, it is assumed to increase the capacitance value $C_f$, or a voltage value of the power source. However, in order to increase the capacitance value $C_f$ of the parasitic capacitance section, it is necessary to be manufactured through fine CMOS processes, so that a smaller voltage value of the power source is necessary; after all, it is impossible to increase the amount of the saturated electric charge. Additionally, if the capacitance value $C_f$ of the parasitic capacitance section is increased, an important advantage of high sensitivity may be lost.

Patent Reference 1: JP-A-11-274454

DISCLOSURE OF THE INVENTION

Problems to be Solved by the Invention

After studying a conventional photo-detecting apparatus in detail, the inventors et al. find out the following problems. That is, though the conventional photo-detecting apparatus can perform photodetection with high sensitivity, there is a problem that the dynamic range of the photodetection is narrowed due to restrictions of the amount of saturated electric charge.

The present invention is made to solve the aforementioned problem, and it is an object to provide a photo-detecting apparatus having a structure which enables photodetection with high sensitivity and wide dynamic range.

MEANS FOR SOLVING THE PROBLEM

A photo-detecting apparatus according to the present invention is characterized by comprising: (1) a pixel section including a photodiode for generating an electric charge of the amount corresponding to intensity of incident light, an amplifying transistor for outputting a voltage value corresponding to the amount of the electric charge accumulated in a parasitic capacitance section formed at its gate terminal, a transmitting transistor for transmitting the electric charge generated at the photodiode to the gate terminal of the amplifying transistor, a discharging transistor for initializing the electric charge of the parasitic capacitance section, and a selecting transistor for outputting selectively the voltage value outputted from the amplifying transistor; (2) a first pixel data readout section for reading out the voltage value outputted from the selecting transistor of the pixel section and outputting a first voltage value corresponding to the voltage value; (3) a connection switching section, having a first terminal connected to the discharging transistor of the pixel section, a second terminal for inputting a bias potential for initializing the electric charge of the gate terminal of the amplifying transistor of the pixel section, and a third terminal, for making an electrical connection between the first terminal and second terminal, or between the first terminal and third terminal; and (4) a second pixel data readout section, of which the input terminal is connected to the third terminal of the connection switching section, and which includes a capacitive element having a larger capacitance value than that of the parasitic capacitance section, for accumulating in the capacitive element the electric charge flown from the third terminal of the connection switching section to the input terminal, and for outputting a second voltage value corresponding to the amount of the accumulated electric charge.

In this photo-detecting apparatus, when light is incident on the pixel section, the amount of the electric charge corresponding to intensity of incident light is generated at the photodiode included in the pixel section, and the electric charge is accumulated in the parasitic capacitance section. The voltage value corresponding to the amount of the electric charge accumulated at the parasitic capacitance section is outputted from the pixel section by way of the amplifying transistor and selecting transistor, and reads out from the first data readout section. Then, the first voltage value corresponding to this readout voltage value is outputted from the first pixel data readout section. When the parasitic capacitance section is not saturated, that is, when the intensity of incident light on the pixel section is comparatively small, the first voltage value represents with high precision a result where the intensity of incident light is detected with high sensitivity.

Further, the electric charge generated at the photodiode included in the pixel section is outputted from the pixel section via the discharging transistor, and inputted to the second pixel data readout section via connection switching means. In the second pixel data readout section, the electric charge flown therein is accumulated in the capacitive element, and the second voltage value corresponding to the amount of the accumulated electric charge is outputted. In this case, the capacitance value of the capacitive element included in the second pixel data readout section is larger than that of the parasitic capacitance section included in the pixel section. Thus, when the parasitic capacitance section is saturated, that is, even when the intensity of incident light on this pixel section is comparatively large, this second voltage value represents with high precision a detected result of the intensity of incident light.

Therefore, according to the photo-detecting apparatus, based on the first voltage value outputted from the first pixel data readout section and the second voltage value outputted from the second pixel data readout section, photodetection can be carried out with high sensitivity and wide dynamic range.

Here, it is preferred that the capacitance value of the capacitive element included in the second data readout section is $2^K$ times as large as that of the parasitic capacitance section, where K is an integer of 1 or more. In this case, when the parasitic capacitance section of the pixel section is not saturated, the second voltage value outputted from the second pixel data readout section can become $1/2^K$ times as small as the first voltage value outputted from the first pixel data readout section. Then, for example, post-processes such as determination whether the parasitic capacitance section of the pixel section is saturated or not, selection of either of the first voltage value and second voltage value, and A/D conversion to both or either of the first voltage value and second voltage value may be facilitated.

It is preferred that in the photo-detecting apparatus according to the invention, the photodiode included in the pixel section has a second semiconductor region of a second conduction-type on a first semiconductor of a first conduction-type, has a third semiconductor region of the first conduction-type on the second semiconductor region, a pn junction is formed between the first semiconductor region and second semiconductor region, and a pn junction is formed between the second semiconductor region and third semiconductor region. Thus, when the photodiode is the one of a buried type, photodetection with further high sensitivity can be performed. Here, one of the first conduction-type and second conduction-type means n-type, while the other thereof means p-type.

It is preferred that the photo-detecting apparatus according to the present invention further includes an interrupting transistor used in a saturation region, while the pixel section is provided between the photodiode and transmitting transistor. Also in this case, photodetection with further high sensitivity can be performed.

It is preferred that the photo-detecting apparatus according to the present invention has a plurality of pixel sections arranged two-dimensionally. In this case, a two-dimensional image can be picked up.

In addition; though the second pixel data readout section may have one capacitive element for each of all the two-dimensionally arranged pixel sections, it preferably has one capacitive element for each column. In the latter case, the electric charge generated at the photodiode included in each pixel section provided in one row can be simultaneously outputted by way of the discharging transistor of the pixel section, inputted to the second pixel data readout section by way of the connection switching means, and accumulated in the corresponding capacitive element provided for each column. Thus, this manner can perform an image pickup at high speed.

Additionally, it is preferred that during the period when the first pixel data readout section processes the voltage value outputted from a pixel section of a certain row, the second pixel data readout section processes the electric charge outputted from the pixel section of the corresponding row. Alternatively, it is preferred that during the period when the first pixel data readout section processes the voltage value outputted from a pixel section of a certain row, the second pixel data readout section processes the electric charge outputted from the pixel section of another row. In this way, when the first pixel data readout section and second pixel data readout section operate in parallel, an image pickup can be carried out without lowering a frame rate.

It is preferred that the photo-detecting apparatus according to the present invention further comprises an A/D converting section for inputting the first voltage value outputted from the first pixel data readout section to be A/D converted, and outputting the first digital value corresponding to the first voltage value, and for inputting the second voltage value outputted from the second pixel data readout section to be A/D converted, and outputting the second digital value corresponding to the second voltage value. Additionally, it is preferred that the photo-detecting apparatus further comprises a selecting output section for inputting the first digital value and second digital value outputted from the A/D converting section, and selecting and outputting either of the first digital value and second digital value, based on a result where any one of the first voltage value, second voltage value, first digital value and second digital value is compared in magnitude to a reference value.

In this case, by means of the A/D converting section, the first voltage value outputted from the first pixel data readout section is A/D converted, and the first digital value corresponding to the first voltage value is outputted, while the second voltage value outputted from the second pixel data readout section is A/D converted, and the second digital value corresponding to the second voltage value is outputted. Then, by means of the selecting output section, based on a result where any one of the first voltage value, second voltage value, first digital value and second digital value is compared in magnitude to a reference value, one of the first digital value and second digital value is selected and outputted.

Alternatively, it is preferred that the photo-detecting apparatus further comprises an A/D converting section for inputting a first voltage value outputted from the first pixel data readout section and a second voltage value outputted from the second pixel data readout section, and selecting and outputting either of the first voltage value and second voltage value, based on a result where either of the first voltage value and second voltage value is compared in magnitude to a reference value. Additionally, it is preferred that the photo-detecting apparatus further comprises an A/D converting section for inputting the voltage value outputted from the selecting output section to be A/D converted, and outputting a digital value corresponding to the voltage value.

In this case, by means of the selecting output section, based on a result where either of the first voltage value and second voltage value is compared in magnitude to a reference value, one of the first voltage value and second voltage value is selected and outputted. Then, by means of the A/D converting section, the voltage value outputted from the selecting output section is A/D converted, and the digital value corresponding to the voltage value is outputted.

It is preferred that in the photo-detecting apparatus according to the present invention, the second pixel data readout section further includes a logarithmic compressing circuit arranged in parallel to the capacitive element, and inputs in the logarithmic compressing circuit the electric charge flown from the third terminal of the connection switching section in the input terminal, and then outputs a third voltage value corresponding to a logarithmic value of the in-flow amount of the inputted electric charge. In this case, from the second pixel data readout section, not only the second voltage value corresponding to the amount of the electric charge generated at the photodiode included in the pixel section be outputted, but also the third voltage value corresponding to the logarithmic value of the in-flow amount of the electric charge is outputted from the logarithmic compressing circuit. Therefore, based on the first voltage value outputted from the first pixel data readout section and the second voltage value and third voltage value outputted from the second pixel data readout section, photodetection can be performed with high sensitivity and wide dynamic range.

Thus, when the second pixel data readout section also includes the logarithmic compressing circuit, it is preferred that the photo-detecting apparatus further comprises an A/D converting section for inputting the first voltage value outputted from the first pixel data readout section to be A/D converted, and outputting the first digital value corresponding to the first voltage value, and for inputting the second voltage value and third voltage value outputted from the second pixel data readout section to be A/D converted, and outputting the second digital value corresponding to the second voltage value and the third digital value corresponding to the third voltage value. Additionally, it is preferred that the photo-detecting apparatus further comprises a selecting output section for inputting the first digital value, second digital value, and third digital value outputted from the A/D converting section, and outputting any one of the first digital value, second digital value, and third digital value, based on a result where any one of the first voltage value, second voltage value, third voltage value, first digital value, second digital value, and third digital value is compared in magnitude to a reference value.

Alternatively, it is preferred that the photo-detecting apparatus further comprises a selecting output section for inputting the first voltage value outputted from the first pixel data readout section, and the second voltage value and third voltage value outputted from the second pixel data readout section, and for outputting any one of the first voltage value, second voltage value, and third voltage value, based on a result where any one of the first voltage value, second voltage value, and third voltage value is compared in magnitude to a reference value.

Effect of the Invention

In accordance with the invention, photodetection with high sensitivity and wide dynamic range becomes possible.

Figure 1:
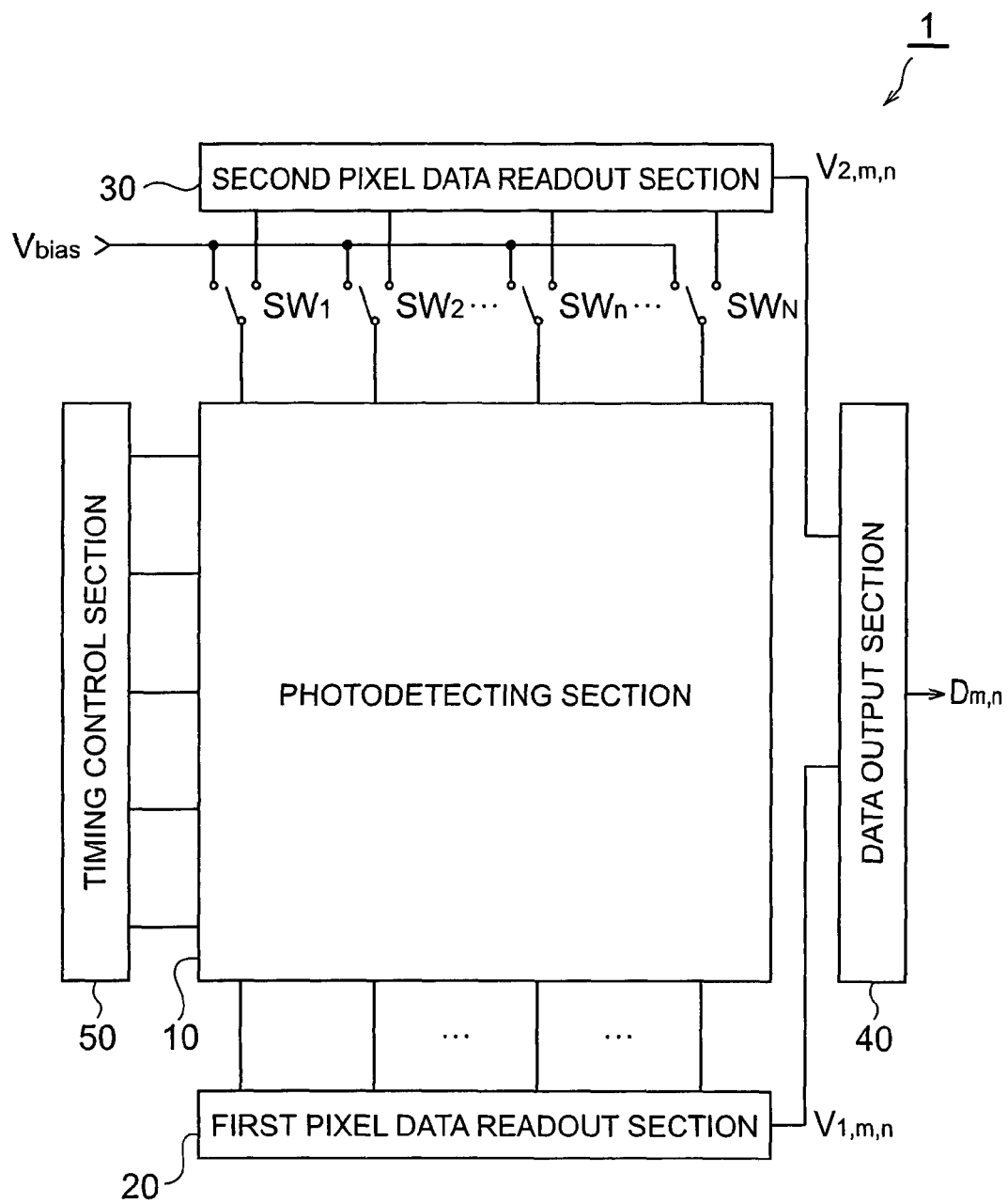
FIG. 1 is a diagram showing a schematic construction of a first embodiment of a photo-detecting apparatus according to the present invention.

DESCRIPTION OF THE REFERENCE NUMERALS 1, 2 . . . photo-detecting apparatus; 10 . . . photo-detecting section; 20 . . . first pixel data readout section; 30, 30A . . . second pixel data readout section; 40, 40A . . . data output section; and 50, 50A . . . timing control section.

BEST MODES FOR CARRYING OUT THE INVENTION

In the following, the best modes for carrying out the inventions will be explained in detail with reference to FIGS. 1 to 17. In the explanation of the drawings, the same elements will be denoted by the same reference symbols and these redundant descriptions will be omitted. In addition, M and N are integers of 2 or more; m is an arbitrary integer of 1 or more and M or less, and n is an arbitrary integer of 1 or more and N or less, as far as these are not specifically defined.

First Embodiment

The summary of the whole construction of a photo-detecting apparatus 1 according to a first embodiment will be first explained with reference to FIGS. 1 and 2.

Figure 2:
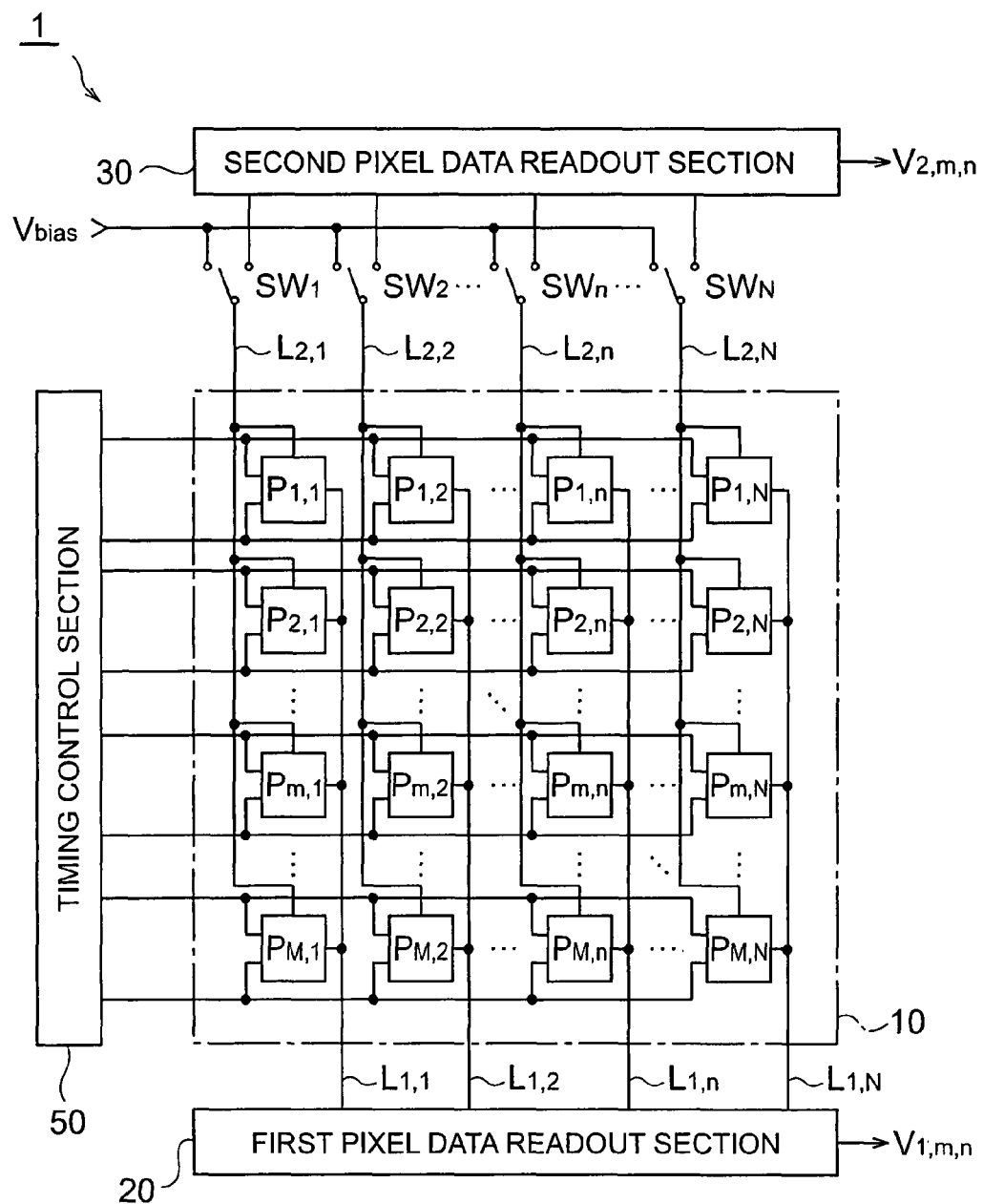
FIG. 2 is a diagram showing a construction of a photo-detecting section in the photo-detecting apparatus according to a first embodiment.

FIG. 1 is a schematic diagram of the photo-detecting apparatus 1 according to the first embodiment. FIG. 2 is a diagram of a photo-detecting section 10 of the photo-detecting apparatus 1 according to the first embodiment. The photo-detecting apparatus 1 shown in these figures is composed of the photo-detecting section 10, a first pixel data readout section 20, a second pixel data readout section 30, a data output section 40, a timing control section 50 and switches $SW_1$ to $SW_n$. It is preferred that these components are formed on a common semiconductor substrate. In the case, it is preferred that a layout on the substrate is the same one as depicted in these figures. Here, the timing control section 50 may be divided into a plurality of parts and arranged apart from each other on the substrate, though it is schemed to control the whole operation of the photo-detecting apparatus 1.

The photo-detecting section 10 has M×N pixel sections $P_{m,n}$ that are two-dimensionally arranged by M rows and N columns. Each pixel section $P_{m,n}$ is positioned at m-th row and n-th column. Each pixel section $P_{m,n}$ a common construction, which is the one of an active-pixel type including a photodiode, and outputs a voltage value corresponding to intensity of light incident on the photodiode to, a wiring $L_{1,n}$. Each wiring $L_{1,n}$ is commonly connected to the output ends of M pixel sections $P_{1,n}$ to $P_{M,n}$, while each wiring $L_{2,n}$ is commonly connected to the other ends of M pixel sections $P_{1,n}$ to $P_{M,n}$ that are located at n-th column.

The first pixel data output section 20 is connected to N wirings $L_{1,1}$ to $L_{1,N}$, and inputs a voltage value that is outputted from each pixel section $P_{m,n}$ to the wiring $L_{1,n}$, and outputs in sequence a first voltage value $V_{1,m,n}$ representing a pixel data after a predetermined processing is carried out. Each voltage value $V_{1,m,n}$ is a value corresponding to intensity of light incident on the pixel section $P_{m,n}$. Specifically, when the first voltage value $V_{1,m,n}$ represents a result detecting the intensity of the incident light with high sensitivity when a parasitic capacitance section of the pixel section $P_{m,n}$ is not saturated, that is, when the intensity of the incident light on the pixel section $P_{m,n}$ is relatively small.

The second pixel data output section 30 is connected to N wirings $L_{2,1}$ to $L_{2,N}$ through the switches $SW_1$ to $SW_n$, and inputs an electric charge that is outputted from each pixel section $P_{m,n}$ to the wiring $L_{2,n}$ and flown therein through the switch $SW_n$. The electric charge is accumulated in the capacitive element, and a second voltage value $V_{2,m,n}$ corresponding to the amount of the electric charge accumulated in the capacitive element is outputted in sequence. The capacitance value of the capacitive element included in the second pixel data readout section 30 is larger than that of the parasitic capacitance section included in the pixel section $P_{m,n}$. Each voltage value $V_{2,m,n}$ is a value corresponding to intensity of light incident on the pixel section $P_{m,n}$. In addition, the second voltage value $V_{2,m,n}$ represents detected results of the intensity of the incident light with high precision when the parasitic capacitance section of the pixel section $P_{m,n}$ is saturated, that is, when intensity of incident light on the pixel section $P_{m,n}$ is comparatively strong.

The data output section 40 inputs a first voltage value $V_{1,m,n}$ outputted from the first pixel data readout section 20 and a first voltage value $V_{2,m,n}$ outputted from the second pixel data readout section 30, and outputs a digital valued $D_{m,n}$ after a predetermined processing is carried out. Each digital value $D_{m,n}$ is a value as a result where either of the first voltage value $V_{1,m,n}$ and second voltage value $V_{2,m,n}$ is A/D converted, and represents intensity of light incident on the pixel section $P_{m,n}$.

The timing control section 50 controls the operations of the photo-detecting section 10, first pixel data readout section 20, second pixel data readout section 30, data output section 40, and switches $SW_1$ to $SW_N$, respectively. The timing control section 50 generates a variety of control signals at a given timing, for example, by a shift register circuit, and these control signals are transmitted to the photo-detecting section 10, first pixel data readout section 20, second pixel data readout section 30, data output section 40 and switches $SW_1$ to $SW_N$, respectively. It is noted that in FIGS. 1 and 2, drawings of wirings for transmitting the control signals are partially omitted.

The constructions of the photo-detecting section 10 and first pixel data readout section 20 of the photo-detecting apparatus 1 according to the first embodiment will next be explained with respect to FIGS. 3 and 4.

Figure 3:
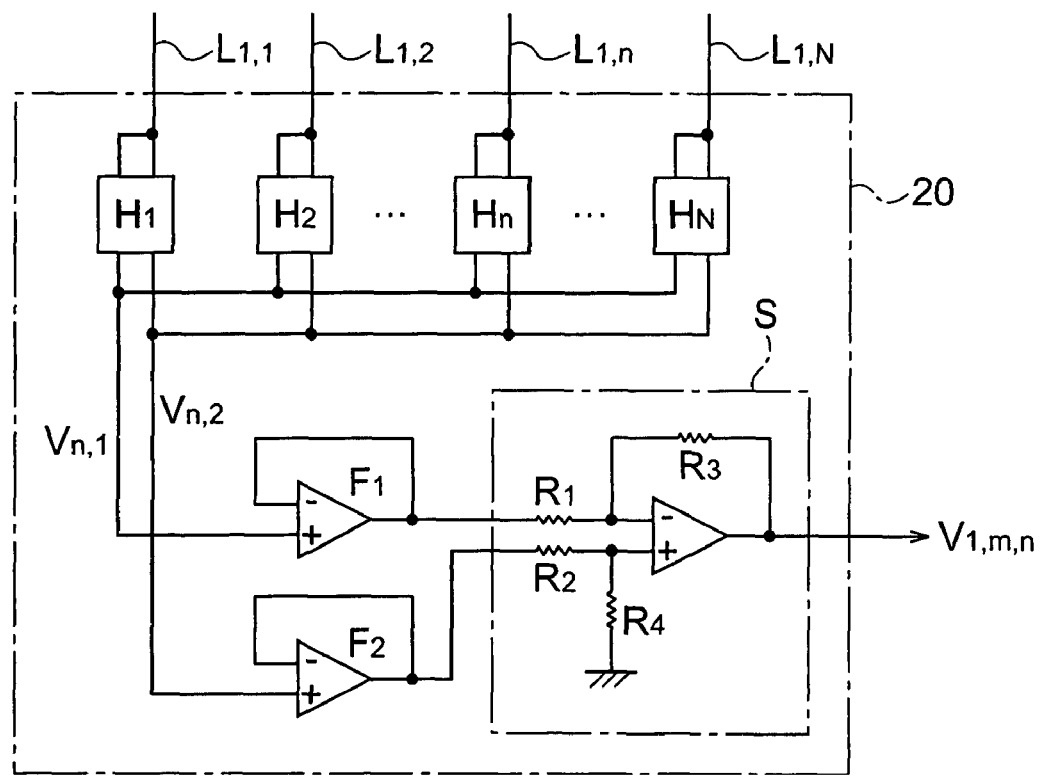
FIG. 3 is a diagram showing a construction of a first pixel data readout section in the photo-detecting apparatus according to the first embodiment.

FIG. 3 is a schematic diagram of the first pixel data readout section 20 of the photo-detecting apparatus 1 according to the first embodiment. The first pixel data readout section 20 has N voltage holding section $H_1$ to $H_N$, two voltage follower circuits $F_1$, $F_2$ and a subtracting circuit S. Each voltage holding section $H_n$ has a common construction and is connected with a wiring $L_{1,n}$, and inputs and holds a voltage value, which is outputted from each of M pixel sections $P_{1,n}$ to $P_{M,n}$ positioned at n-th column, to a wiring $L_{1,n}$, and further can output the holding voltage value. The N voltage holding sections $H_1$ to $H_N$ each output a voltage value in sequence. The voltage values held and outputted by each voltage holding section $H_n$ are two voltage values $V_{n,1}$, $V_{n,2}$ outputted from the pixel section $P_{m,n}$ at different times from each other.

The two voltage follower circuits $F_1$, $F_2$ each have a common construction; an inverting input terminal and an output terminal of an amplifier are directly connected to each other, to thus have a high input impedance and a low output impedance, ideally resulting in an amplifier having amplification factor of 1. In the one voltage follower circuit $F_1$, the one voltage values $V_{n,1}$ outputted sequentially from the N voltage holding sections $H_1$ to $H_N$ are inputted to a non-inverting input terminal. In the other voltage follower circuit $F_2$, the other voltage values $V_{n,2}$ outputted sequentially from the N voltage holding sections $H_1$ to $H_N$ are inputted to a non-inverting input terminal.

The subtracting circuit S has an amplifier and four resistors $R_1$ to $R_4$. The inverting input terminal of the amplifier is connected to the output terminal of the voltage follower circuit $F_1$ via the resistor $R_1$, and connected to its own output terminal via the resistors $R_3$. The non-inverting input terminal of the amplifier is connected to the output terminal of the voltage follower circuit $F_2$ via the resistor $R_2$, and connected to ground potential via the resistors $R_4$. Assuming that the resistance values of the resistors $R_1$ to $R_4$ are equal to each other, where the amplification ratio of each of the voltage follower circuits $F_1$, $F_2$ is 1, the first voltage value $V_{1,m,n}$ outputted from the output terminal of the subtracting circuit S is expressed by the following equation: $V_{1,m,n}=V_{n,2}-V_{n,1}$.

Figure 4:
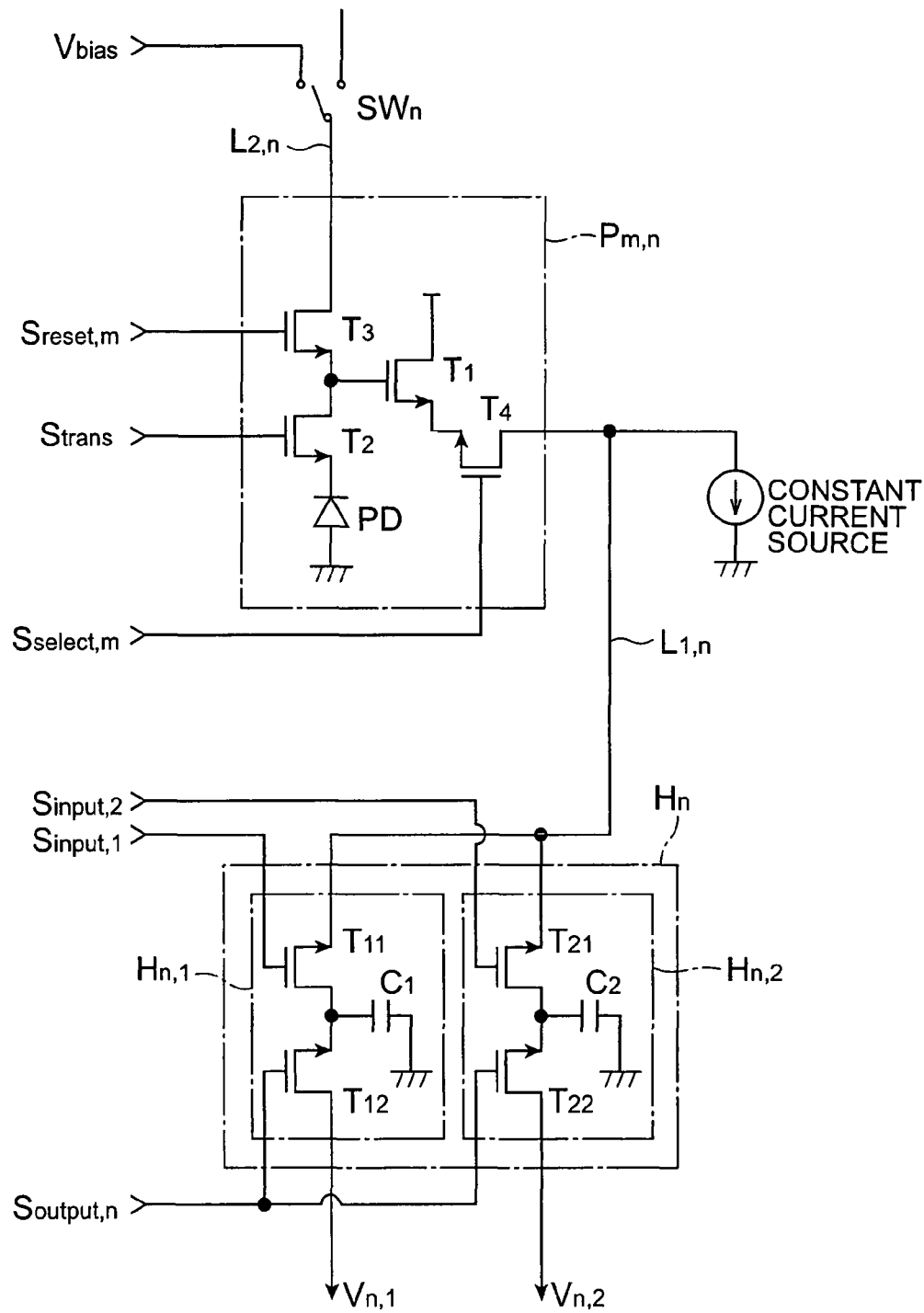
FIG. 4 is a circuit diagram of each of a pixel section $P_{m,n}$, a voltage holding section $H_n$, and a switch $SW_n$ in the photo-detecting apparatus according to the first embodiment.

FIG. 4 is a circuit diagram of each of the pixel section $P_{m,n}$, voltage holding section $H_n$ and switch $SW_n$ of the photo-detecting apparatus 1 according to the first embodiment. In this drawing, one pixel section $P_{m,n}$, one voltage holding section $H_n$, and one switch $SW_n$ are representatively illustrated for simplicity.

Each pixel section $P_{m,n}$ includes a photodiode PD for generating an electric charge of an amount of corresponding to intensity of incident light, an amplifying transistor $T_1$ for outputting a voltage value of the amount of an electric charge accumulated in a parasitic capacitance section formed in its gate terminal, a transmitting transistor $T_2$ for transmitting the electric charge generated at the photodiode to the gate terminal of the amplifying transistor $T_1$, a discharging transistor $T_3$ for initializing the electric charge of the parasitic capacitance section formed in the gate terminal of the amplifying transistor $T_1$, and a selecting transistor $T_4$ for outputting a voltage value outputted from the amplifying transistor $T_1$ to an external wiring $L_{1,n}$.

In the photodiode PD, its anode terminal is set to ground potential. In the amplifying transistor $T_1$, a parasitic capacitance section is formed in its gate terminal, and its drain terminal is set to a bias potential. In the transmitting transistor $T_2$, its drain terminal is connected to the gate terminal of the amplifying transistor $T_1$, and its source terminal is connected to the cathode terminal of the photodiode PD. In the discharging transistor $T_3$, its source terminal is connected to the gate terminal of the amplifying transistor $T_1$, and its drain terminal is connected to the switch $SW_n$. In the selecting transistor $T_4$, its source terminal is connected to the source terminal of the amplifying transistor $T_1$ and its drain terminal is connected to the wiring $L_{1,n}$. Additionally, a constant current source is connected to the wiring $L_{1,n}$. The amplifying transistor $T_1$ and selecting transistor $T_4$ constitute a source follower circuit.

Here, the constant current source may be connected to the wiring $L_{1,n}$ for each line to be arranged. For example, in a case where switches are respectively arranged between the wirings $L_{1,n}$ and the first pixel data readout section 20, and where the first pixel data readout section 20 reads out sequentially voltage values outputted from the respective N pixel sections $P_{m,1}$ to $P_{m,N}$ at m-th row in such a manner that these switches are closed sequentially, only one constant current source may be arranged between these switches and the first pixel data readout section 20.

In the transmitting transistor $T_2$, a transmission control signal $S_{trans}$ is inputted to its gate terminal, and when the transmission control signal $S_{trans}$ is a high level, the electric charge generated at the photodiode PD is transmitted to the parasitic capacitance section formed at the gate terminal of the amplifying transistor $T_1$. In the discharging transistor $T_3$, a discharge control signal $S_{reset,m}$ at m-th row is inputted to its gate terminal, and when discharge control signal $S_{reset,m}$ at m-th row is a high level, a low resistance is provided between the gate electrode of the amplifying transistor $T_1$ and the switch $SW_n$. In the selecting transistor $T_4$, a selection control signal $S_{select,m}$ at m-th row is inputted to its gate terminal, and when the selection control signal $S_{select,m}$ at m-th row is a high level, a voltage value outputted from the amplifying transistor $T_1$ is outputted to an external wiring $L_{1,n}$.

In the thus constructed pixel section $P_{m,n}$, the transmission control signal $S_{trans}$ is a low level, and the discharge control signal $S_{reset,m}$ at m-th row is a high level; when a bias potential $V_{bias}$ is inputted to the discharging transistor $T_3$ via the switch $SW_n$, the electric charge of the parasitic capacitance section of the gate terminal of the amplifying transistor $T_1$ is initialized; when the selection control signal $S_{select,m}$ at m-th row is a high level, a voltage value (dark signal component) outputted from the amplifying transistor $T_1$ put in an initialized state is outputted to the wiring $L_{1,n}$ via the selecting transistor $T_4$. On the other hand, when the discharge control signal $S_{reset,m}$ at m-th row is a low level, and the transmission control signal $S_{trans}$ and selection control signal $S_{select,m}$ at m-th row each are a high level, the electric discharge generated at the photodiode PD is inputted to the gate terminal of the amplifying transistor $T_1$, and a voltage value (bright signal component) outputted from the amplifying transistor $T_1$ corresponding to the amount of the electric discharge is outputted to the wiring $L_{1,n}$ via the selecting transistor $T_4$.

The voltage holding section $H_n$ includes a first holding section $H_{n,1}$ and a second holding section $H_{n,2}$. The first holding section $H_{n,1}$ and second holding section $H_{n,2}$ have a similar construction to each other, and can input and hold voltage values outputted sequentially from the selecting transistor $T_4$ of each of the M pixel sections $P_{1,n}$ to $P_{M,n}$ located at n-th column, and further output the held voltage value.

The first holding section $H_{n,1}$ includes a transistor $T_{11}$, a transistor $T_{12}$, and a capacitive element $C_1$. One terminal of the capacitive element $C_1$ is set to ground potential, while the other terminal of the capacitive element $C_1$ is connected to the drain terminal of the transistor $T_{11}$ and the source terminal of the transistor $T_{12}$. The source terminal of the transistor $T_{11}$ is connected to the selecting transistor $T_4$ of the pixel section $P_{m,n}$ via the wiring $L_{1,n}$. The drain terminal of the transistor $T_{12}$ is connected to the voltage follower circuit $F_1$. In the thus constructed first holding section $H_{n,1}$, when a first input control signal $S_{input,1}$ inputted to the gate terminal of the transistor $T_{11}$ is a high level, a voltage value outputted from the pixel section $P_{m,n}$ connected via the wiring $L_{1,n}$ is held in the capacitive element $C_1$, while when an output control signal $S_{output,n}$ inputted to the gate terminal of the transistor $T_{12}$ is a high level, a voltage value $V_{n,1}$ held in the capacitive element $C_1$ is outputted to the voltage follower circuit $F_1$.

The second holding section $H_{n,2}$ includes a transistor $T_{21}$, a transistor $T_{22}$, and a capacitive element $C_2$. One terminal of the capacitive element $C_2$ is set to ground potential, while the other terminal of the capacitive element $C_2$ is connected to the drain terminal of the transistor $T_{21}$ and the source terminal of the transistor $T_{22}$. The source terminal of the transistor $T_{21}$ is connected to the selecting transistor $T_4$ of the pixel section $P_{m,n}$ via the wiring $L_{1,n}$. The drain terminal of the transistor $T_{22}$ is connected to the voltage follower circuit $F_2$. In the thus constructed second holding section $H_{n,2}$, when a second input control signal $S_{input,2}$ inputted to the gate terminal of the transistor $T_{21}$ is a high level, a voltage value outputted from the pixel section $P_{m,n}$ connected via the wiring $L_{1,n}$ is held in the capacitive element $C_2$, while when an output control signal $S_{output,n}$ inputted to the gate terminal of the transistor $T_{22}$ is a high level, a voltage value $V_{n,2}$ held in the capacitive element $C_2$ is outputted to the voltage follower circuit $F_2$.

The first holding section $H_{n,1}$ and second holding section $H_{n,2}$ each operate at a different timing from each other. For example, in the first holding section $H_{n,1}$, the transmission control signal $S_{trans}$ is a low level in the pixel section $P_{m,n}$ connected via the wiring $L_{1,n}$, and the discharge control signal $S_{reset,m}$ at m-th row and selection control signal $S_{select,m}$ at m-th row each are a high level, the voltage value (dark signal component) $V_{n,1}$ outputted from the amplifying transistor $T_1$ is inputted and held. On the other hand, in the second holding section $H_{n,2}$, the discharge control signal $S_{reset,m}$ at m-th row in the pixel section $P_{m,n}$ connected via the wiring $L_{1,n}$ is a low level, and the transmission control signal $S_{trans}$ and selection control signal $S_{select,m}$ at m-th row each are a high level, the voltage value (bright signal component) $V_{n,2}$ outputted from the amplifying transistor $T_1$ is inputted and held.

It should be noted that the transmission control signal $S_{trans}$, discharge control signal $S_{reset,m}$ at m-th row, selection control signal $S_{select,m}$ at m-th row, first input control signal $S_{input,1}$, second input control signal $S_{input,2}$, output control signal $S_{output,n}$ at n-th column each are outputted from the timing control section 50.

The construction of the second pixel data readout section 30 of the photo-detecting apparatus 1 according to the first embodiment will next be explained with reference to FIGS. 5 and 6.

Figure 5:
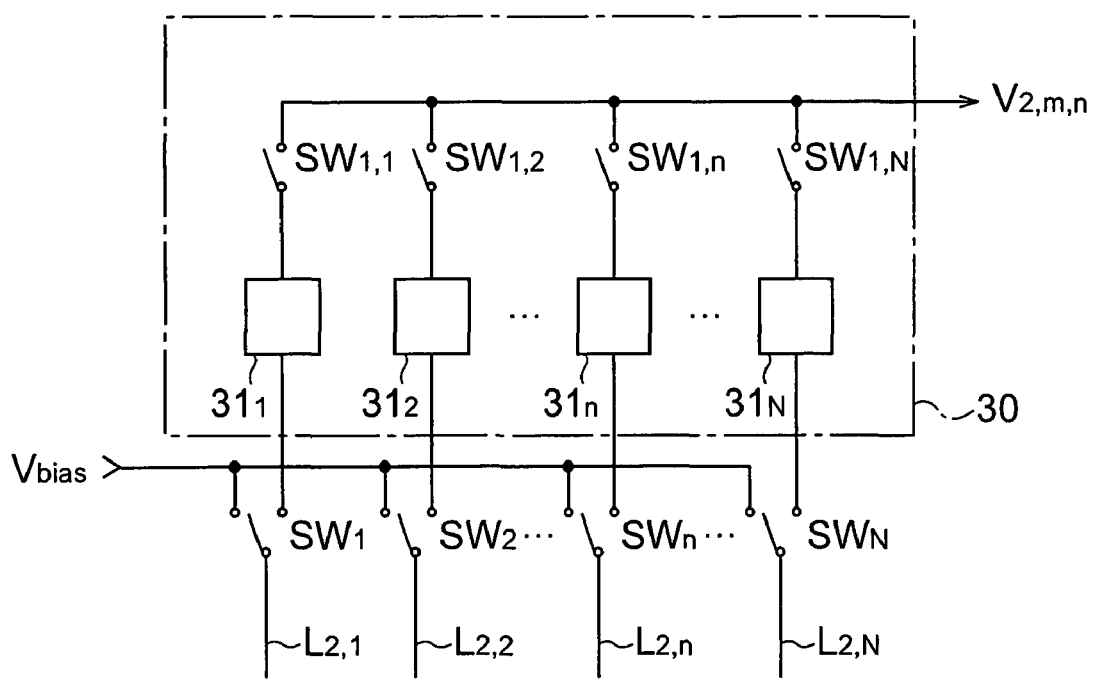
FIG. 5 is a diagram showing a construction of a second pixel data readout section in the photo-detecting apparatus according to the first embodiment.

FIG. 5 is a schematic diagram of the second pixel data readout section 30 of the photo-detecting apparatus 1 according to the first embodiment. The second pixel data readout section 30 has N integrating circuits $31_1$ to $31_N$, and N switches $SW_{1,1}$ to $SW_{1,N}$. Each integrating circuit $31_n$ has a common construction, and has a capacitive element for accumulating an electric charge flown in its input end from the switch $SW_n$, and outputs a voltage value corresponding to the amount of the electric charge accumulated in this capacitive element to the switch $SW_{1,n}$. The second pixel data readout section 30 outputs a voltage value outputted from each of the N integrating circuits $31_1$ to $31_N$ as a second voltage value $V_{2,m,n}$ by closing sequentially the switches $SW_{1,1}$ to $SW_{1,N}$.

Figure 6:
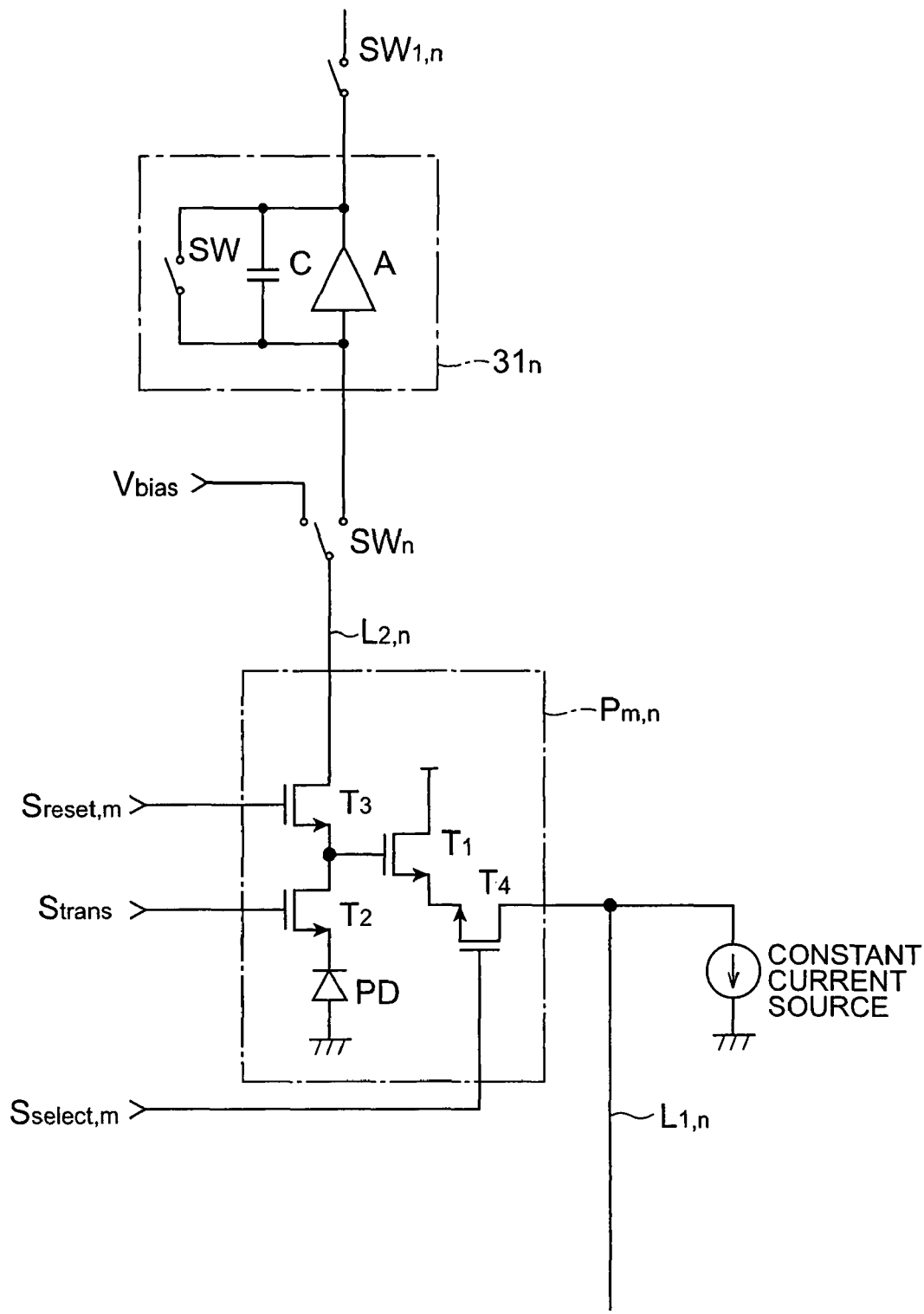
FIG. 6 is a circuit diagram of each of a pixel section $P_{m,n}$, an integration section $31_n$, and a switch $SW_n$ in the photo-detecting apparatus according to the first embodiment.

FIG. 6 is a circuit diagram of the pixel section $P_{m,n}$, integrating circuit $31_n$, and switch $SW_n$ of the photo-detecting apparatus 1 according to the first embodiment. In this drawing, one pixel section $P_{m,n}$, one integrating circuit $31_n$, and one switch $SW_n$ are representatively illustrated for simplicity.

Each integrating circuit $31_n$ has an amplifier A, a capacitive element C and a switch SW. The capacitive element C and switch SW each are arranged in parallel between the input and output terminals of the amplifier A. A capacitance value of this capacitive element C is larger than that of the parasitic capacitance section formed at the gate terminal of the amplifying transistor $T_1$ of the pixel section $P_{m,n}$. Additionally, it is preferred that the capacitance value of the capacitive element C is $2^K$ times as large as that of the parasitic capacitance section, where K is an integer of 1 or more. This integrating circuit $31_n$ initializes the capacitive element C when the switch SW is closed. Also, the integrating circuit $31_n$ accumulates in the capacitive element C the electric charge flown in its input terminal from the wiring $L_{2,n}$ via the switch $SW_n$ when the switch SW is opened, and outputs the voltage value corresponding to the amount of the electric charge accumulated in the capacitive element to the switch $SW_{1,n}$.

Each switch $SW_n$ has a first terminal connected to the drain terminal of the discharging transistor $T_3$ of the pixel section $P_{m,n}$, a second terminal connected to a bias potential $V_{bias}$ to initialize the electric charge of the gate terminal of the amplifying transistor $T_1$ of the pixel section $P_{m,n}$ and a third terminal connected to the input terminal of the integrating circuit $31_n$. Then, the switch $SW_n$ operates as a connection switching section to establish an electrical connection between the first terminal and second terminal, or between the first terminal and third terminal. When the electrical connection is made between the first terminal and second terminal of the switch $SW_n$, the bias potential $V_{bias}$ is supplied to the discharging transistor $T_3$ of the pixel section $P_{m,n}$ via the switch $SW_n$. On the other hand, when the electrical connection is made between the first terminal and third terminal of the switch $SW_n$, the electric charge generated at the photodiode of the pixel section $P_{m,n}$ is moved to the input terminal of the integrating circuit $31_n$ via the discharging transistor $T_3$ and switch $SW_n$.

Note that a control signal to control each opening/closing operations of each of the switches SW, $SW_n$, $SW_{1,n}$ is outputted from the timing control section 50. Also, in the switch $SW_n$, there is a state such that no electrical connections between the first terminal and second terminal, and between the first terminal and third terminal are established.

The construction of the data output section 40 of the photo-detecting apparatus 1 according to the first embodiment will next be explained with reference to FIGS. 7 and 8.

Figure 7:
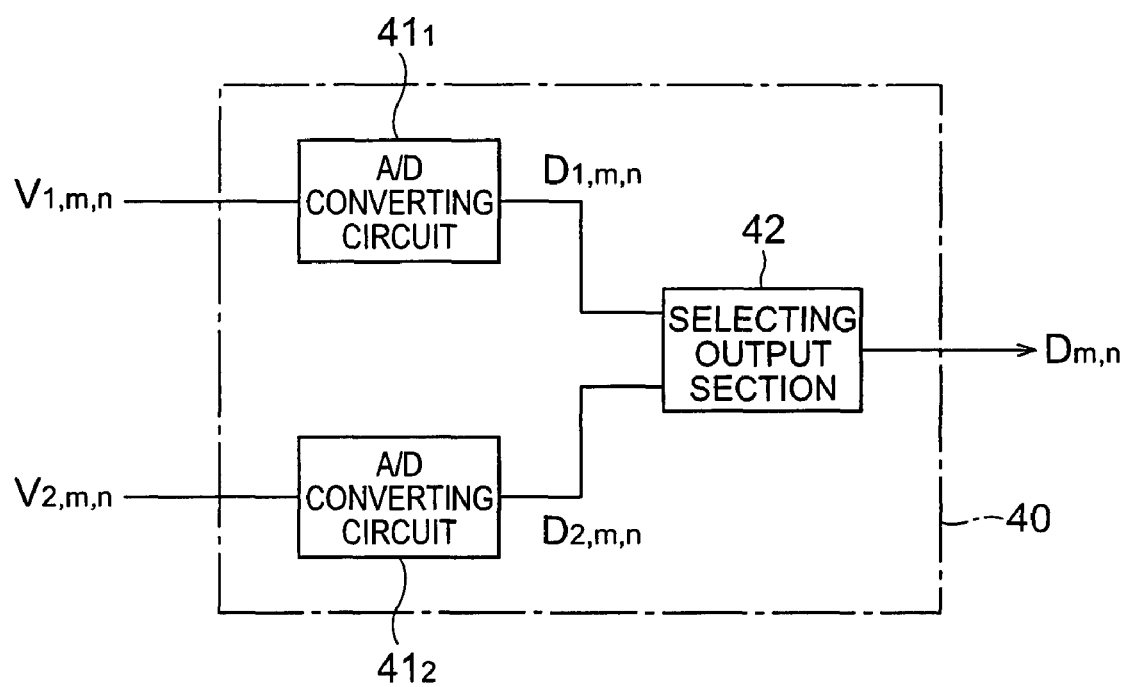
FIG. 7 is a diagram showing one construction example of a data output section in the photo-detecting apparatus according to the first embodiment.

FIG. 7 is a diagram showing one constructional example of the data output section 40 of the photo-detecting apparatus 1 according to the first embodiment. The data output section 40 shown in this drawing has A/D converting circuits $41_1$, $41_2$ and a selecting output section 42. The A/D converting circuits $41_1$ inputs a first voltage value $V_{1,m,n}$ outputted from the first pixel data readout section 20 to be A/D converted, and outputs a first digital value $D_{1,m,n}$ corresponding to the first voltage value $V_{1,m,n}$. The A/D converting circuits $41_2$ inputs a second voltage value $V_{2,m,n}$ outputted from the second pixel data readout section 30 to be A/D converted, and outputs a second digital value $D_{2,m,n}$ corresponding to the second voltage value $V_{2,m,n}$.

Here, corresponding to a fact that the capacitance value of the capacitive element C of each integrating circuit $31_n$ is $2^K$ times as large as that of the parasitic capacitance section of the pixel section $P_{m,n}$, the first digital value where the input voltage value to the A/D converting circuit $41_1$ is one value V and a selecting output section 42, and the second digital value where the input voltage value to the A/D converting circuit $41_2$ is $V/2^K$ are equal to each other.

The selecting output section 42 inputs the first digital value $D_{1,m,n}$ and second digital value $D_{2,m,n}$, selects one of the first digital value $D_{1,m,n}$ and second digital value $D_{2,m,n}$ based on a result that compares in magnitude the first digital value $D_{1,m,n}$ with a reference value, and outputs the selected value as a digital value $D_{m,n}$.

Specifically, the reference value is set to a digital value corresponding to a saturation value of the first voltage value outputted from the first pixel data readout section 20, or set to a digital value slightly smaller than this value. That is, when the first digital value $D_{1,m,n}$ and the reference value are compared in magnitude, it can be determined whether the parasitic section of the pixel section $P_{m,n}$ is saturated or not. Then, when the first digital value $D_{1,m,n}$ is smaller than the reference value, the selecting output section 42 outputs the first digital value $D_{1,m,n}$ as a digital value $D_{m,n}$, while when the first digital value $D_{1,m,n}$ is the reference value or more, the section 42 outputs the second digital value $D_{2,m,n}$ as a digital value $D_{m,n}$.

Here, instead of comparing the first digital value $D_{1,m,n}$ to the reference value, the second digital value $D_{2,m,n}$ may be compared in magnitude to the reference value, and the first voltage value $V_{1,m,n}$ or the second voltage value $V_{2,m,n}$ may be compared in magnitude to the reference value. In any one of these cases, the reference value is set to a value that can determine whether the parasitic section of the pixel section $P_{m,n}$ is saturated or not.

As mentioned above, when the parasitic capacitance section of the pixel section $P_{m,n}$ is not saturated, that is, when intensity of incident light to the pixel section $P_{m,n}$ is comparatively small, the first digital value $D_{1,m,n}$ (that is, an A/D converted result of the first voltage value $V_{1,m,n}$ outputted from the selecting transistor $T_4$ of the pixel section $P_{m,n}$ and read out from the first pixel data readout section 20) is outputted from the data output section 40 as the digital value $D_{m,n}$, thereby enabling photodetection with high sensitivity. On the other hand, when the parasitic capacitance section of the pixel section $P_{m,n}$ is saturated (or, when it is a status on the verge of saturation), that is, when the intensity of incident light on the pixel section $P_{m,n}$ is comparatively greater, the second digital value $D_{2,m,n}$ (that is, an A/D converted result of the second voltage value $V_{2,m,n}$ outputted from the discharging transistor $T_3$ of the pixel section $P_{m,n}$ and read out from the second pixel data readout section 30) is outputted from the data output section 40 as the digital value $D_{m,n}$, thereby enabling photodetection with wide dynamic range. Therefore, the photo-detecting apparatus 1 according to the first embodiment can carry out an image pickup with high sensitivity and wide dynamic range.

Figure 8:
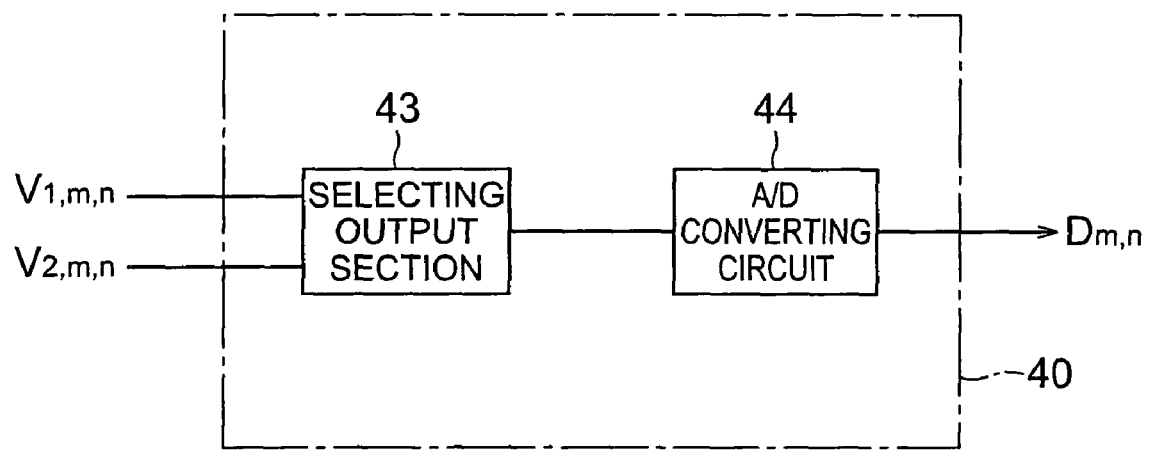
FIG. 8 is a diagram showing another construction example of the data output section in the photo-detecting apparatus according to the first embodiment.

FIG. 8 is a diagram showing another constructional example of the data output section 40 of the photo-detecting apparatus 1 according to the first embodiment. The data output section 40 presented in this drawing has a selecting output section 43 and an A/D converting circuit 44. The selecting output section 43 inputs the first voltage value $V_{1,m,n}$ outputted from the first pixel data readout section 20 and the second voltage value $V_{2,m,n}$ outputted from the second pixel data readout section 30, selects one of the first voltage value $V_{1,m,n}$ and the second voltage value $V_{2,m,n}$ to be outputted, based on a result where the first voltage value $V_{1,m,n}$ and a reference value is compared in magnitude to each other.

Specifically, the reference value is set to a saturation value of the first voltage value $V_{1,m,n}$ outputted from the outputted from the first pixel data readout section 20, or set to a slightly smaller value than this saturation value. Thus, it can be determined whether the parasitic capacitance section of the pixel section $P_{m,n}$ is saturated or not by comparing in magnitude the first voltage value $V_{1,m,n}$ with the reference value. Then, the selecting output section 43 outputs the first voltage value $V_{1,m,n}$ when the first voltage value $V_{1,m,n}$ is smaller than the reference value, while it outputs the second voltage value $V_{2,m,n}$ when the first voltage value $V_{1,m,n}$ is the reference value or more.

Additionally, the second voltage value $V_{2,m,n}$ and the reference value may be compared in magnitude instead of making a comparison in magnitude between the first voltage value $V_{1,m,n}$ and the reference value. Also in this case, the reference value is set to a value capable of determining whether the parasitic capacitance section of the pixel section $P_{m,n}$ is saturated or not.

The A/D converting circuit 44 inputs the voltage value outputted from the selecting output section 43 and outputs the digital value $D_{m,n}$ corresponding to this voltage value. Specifically, corresponding to a situation that the capacitance value of the capacitive element C of each integrating circuit $31_n$ is $2^K$ times as large as that of the parasitic capacitance section of the pixel section $P_{m,n}$, when the A/D converting circuit 44 A/D converts the first voltage value $V_{1,m,n}$ outputted from the first pixel data readout section 20, the digital value obtained from the A/D conversion is outputted as the digital value $D_{m,n}$ while when it converts the second voltage value $V_{2,m,n}$ outputted from the second pixel data readout section 30, the digital value obtained from the A/D conversion is shifted to higher order bits by K bits and the resultant is outputted as the digital value $D_{m,n}$.

As mentioned above, when the parasitic capacitance section of the pixel section $P_{m,n}$ is not saturated, that is, when intensity of incident light on the pixel section $P_{m,n}$ is comparatively small, an A/D converted result of the first voltage value $V_{1,m,n}$ outputted from the selecting transistor $T_4$ of the pixel section $P_{m,n}$ and read out by the first pixel data readout section 20 is outputted from the data output section 40 as the digital value $D_{m,n}$, thereby enabling photodetection with high sensitivity. On the other hand, when the parasitic capacitance section of the pixel section $P_{m,n}$ is saturated (or when it is a status on the verge of saturation), that is, when the intensity of incident light on the pixel section $P_{m,n}$ is comparatively great, an A/D converted result of the second voltage value $V_{2,m,n}$ outputted from the discharging transistor $T_3$ of the pixel section $P_{m,n}$ and read out from the second pixel data readout section 30 is outputted from the data output section 40 as the digital value $D_{m,n}$, thereby enabling photodetection with wide dynamic range. Therefore, the photo-detecting apparatus 1 according to the first embodiment can carry out an image pickup with high sensitivity and wide dynamic range.

The construction of the pixel section $P_{m,n}$ of the photo-detecting apparatus 1 according to the first embodiment will next be explained with respect to FIGS. 9 and 10.

Figure 9:
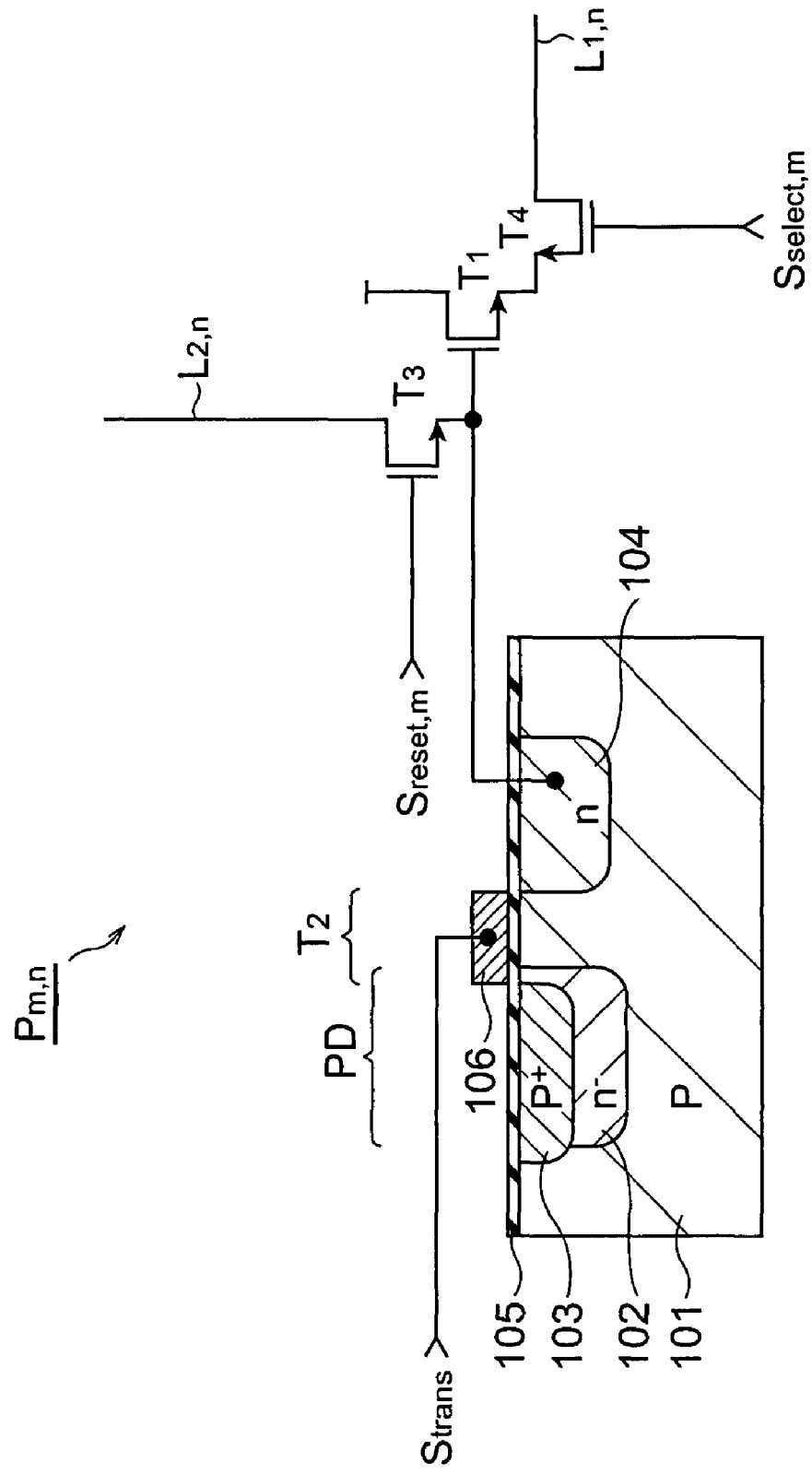
FIG. 9 is a diagram showing a sectional structure of the pixel section $P_{m,n}$ in the photo-detecting apparatus according to the first embodiment.

FIG. 9 is a schematic diagram of the pixel section $P_{m,n}$ of the photo-detecting apparatus 1 according to the first embodiment. In the drawing, the photodiode PD and transmitting transistor $T_2$ are shown in a sectional view of a semiconductor, and the rest thereof is shown in a circuit diagram. As shown in the drawing, the photodiode PD is a buried or embedded one, and constructed by including a p region 101, an n⁻ region 102 on the p region 101, and a p⁺ region 103 on the n⁻ region 102. A pn junction is formed between the p region 101 and n⁻ region 102 is formed, and the pn junction also is formed between the n⁻ region 102 and p⁺ region 103. In addition, part of the n⁻ region 102 reaches to the surface of the semiconductor.

The transmitting transistor $T_2$ is constructed by including an n region 104 on the p region 101, a portion reaching the top surface of the semiconductor of the n⁻ region 102, and a gate electrode 106 formed on an insulating layer 105, located between these regions. The n region 104 is electrically connected to the gate electrode of the amplifying transistor $T_1$, and electrically connected to the source electrode of the discharging transistor $T_3$. The pn junction is formed between the p region 101 and n region 104, and constructs a parasitic capacitance section for storing an electric charge generated in the photodiode PD within the pixel section $P_{m,n}$.

As described above, when the photodiode PD is the buried one, an occurrence of leakage currents is suppressed. Additionally, in a period of time that the electric charge generated at the photodiode PD is transferred to the parasitic capacitance section, when the reverse bias voltage of the photodiode PD is increased, the n⁻ region 102 is completely depleted in the pn junction portion of the photodiode, so that the junction capacitance of the photodiode PD can be brought to nearly zero, and thereby the electric charge generated at the photodiode PD can be transferred almost completely to the parasitic capacitance section. Therefore, the photodiode PD is the buried one, which makes effective to S/N ratio improvement and development of high sensitivity with respect to photodetection.

Figure 10:
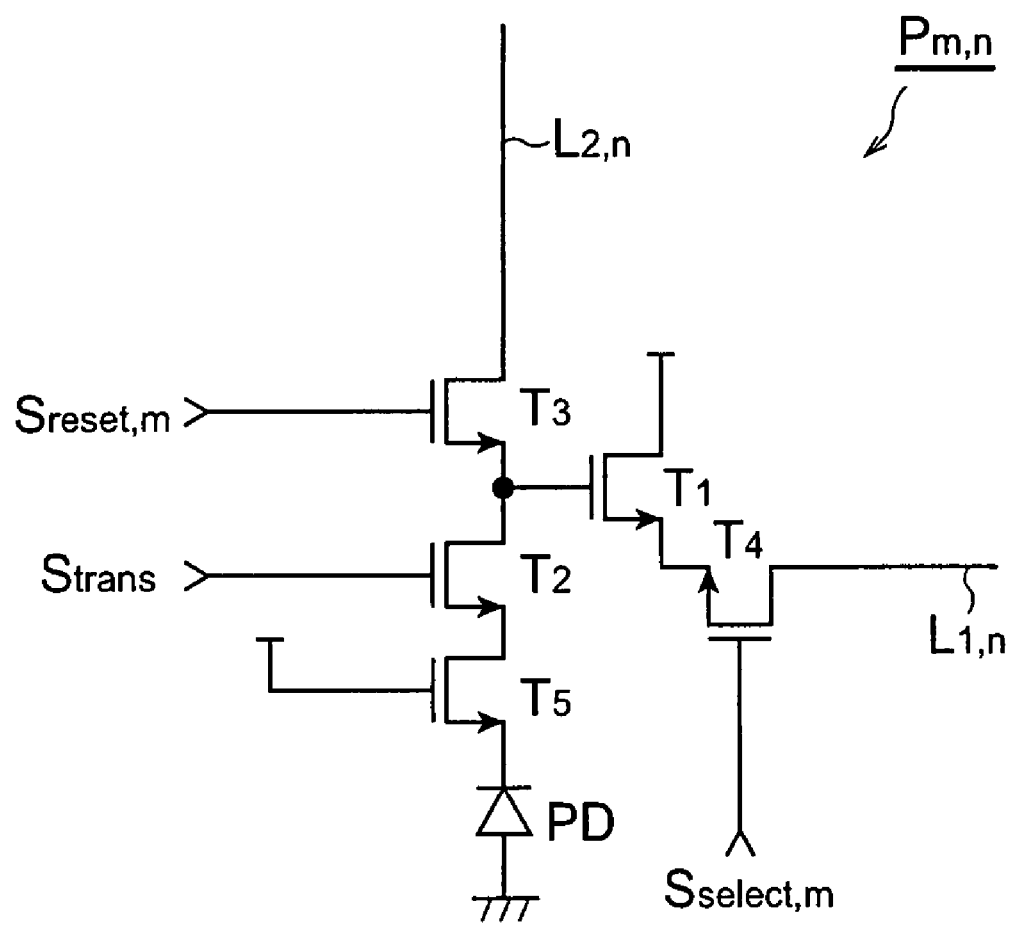
FIG. 10 is a circuit diagram showing another construction of the pixel section $P_{m,n}$ in the photo-detecting apparatus according to the first embodiment.

FIG. 10 is a circuit diagram showing another construction of the pixel section $P_{m,n}$ of the photo-detecting apparatus 1 according to the first embodiment. The pixel section $P_{m,n}$ shown in the drawing further comprises an interrupting transistor $T_5$ in addition to the construction shown in FIGS. 4 and 6. The interrupting transistor $T_5$ is provided between the photodiode PD and transferring transistor $T_5$, and a voltage value as likely operative in a saturation region is applied to the gate electrode thereof. In this way, in the pixel section Pm,n, an influence of the junction capacitance of the photodiode PD on the potential of the gate terminal of the amplifying transistor $T_1$ is suppressed. Therefore, this case also is effective for improvement of S/N ratio and development of high sensitivity.

Figure 11:
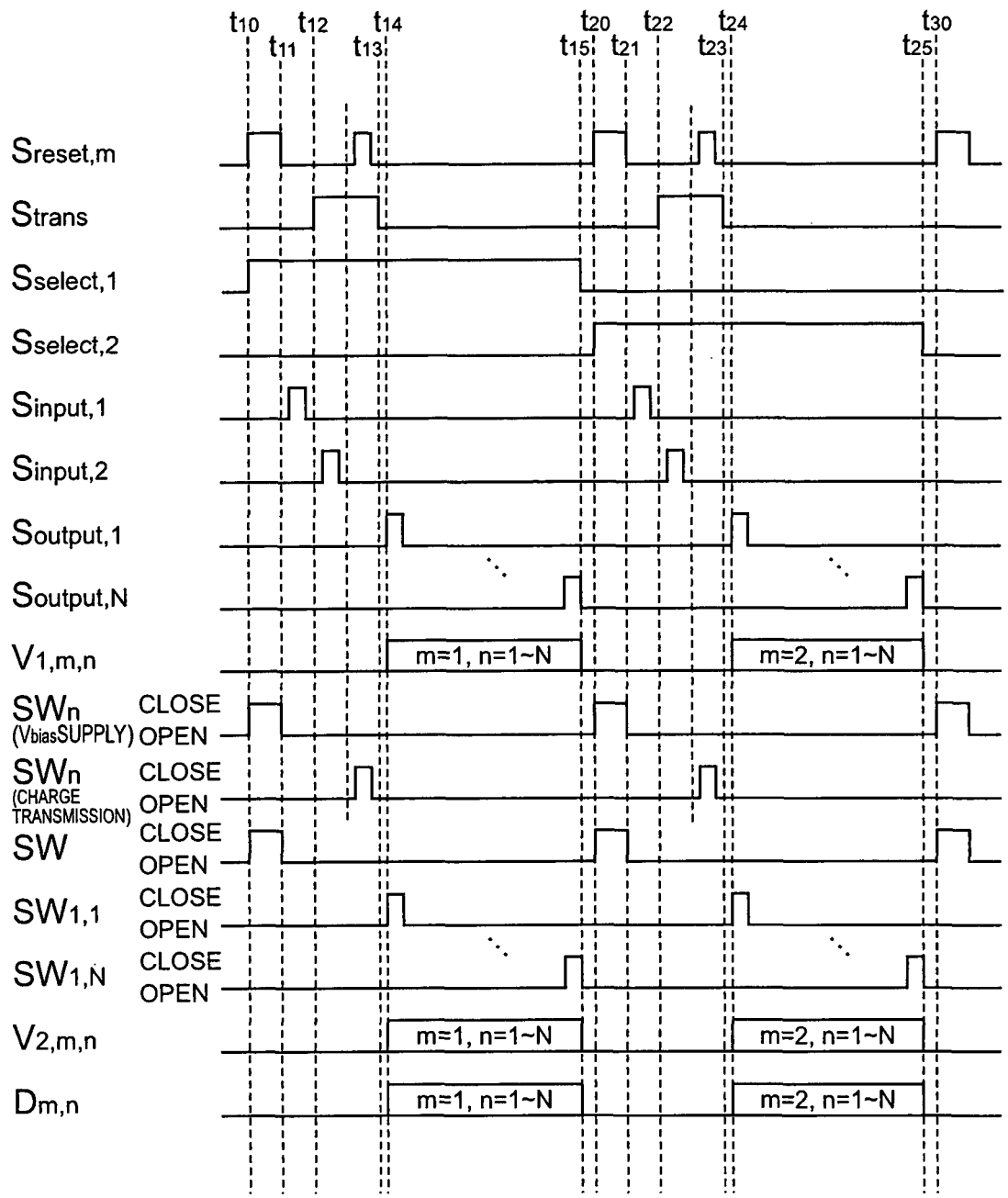
FIG. 11 is a timing chart for explaining an operation example of the photo-detecting apparatus according to the first embodiment.

An example in operation of the photo-detecting apparatus 1 according to the first embodiment will next be explained. FIG. 11 is a timing chart for explaining an example in operation of the photo-detecting apparatus 1 according to the first embodiment. This figure shows a range of times for reading out the respective data of each pixel section $P_{1,n}$ at 1st row and each pixel section $P_{2,n}$ at 2nd row.

In this drawing, in the order from the top, each shown are a discharge control signal $S_{reset,m}$ at m-th row inputted to the gate terminal of the discharging transistor $T_3$ of each pixel section $P_{m,n}$, a transmission control signal $S_{trans}$ inputted at the gate terminal of the transmitting transistor $T_2$ of each pixel section $P_{m,n}$, a selection control signal $S_{select,1}$ at 1st row inputted to the gate terminal of the selecting transistor $T_4$ of the pixel section $P_{1,n}$ at 1st row, and a selection control signal $S_{select,2}$ at 2nd row inputted to the gate terminal of the selecting transistor $T_4$ of the pixel section $P_{2,n}$ at 2nd row.

Subsequently, each shown are a first input control signal $S_{input,1}$ inputted to the gate terminal of a transistor $T_{11}$ of a first holding section $H_{n,1}$ of each voltage holding section $H_n$, a second input control signal $S_{input,2}$ inputted to the gate terminal of a transistor $T_{21}$ of a second holding section $H_{n,2}$ of each voltage holding section $H_n$, an output control signal $S_{output,1}$ at 1st column inputted to each gate terminal of the transistors $T_{12}$ and $T_{22}$ of a voltage holding section $H_1$ at 1st column, an output control signal $S_{output,N}$ at N-th column inputted to each gate terminal of the transistors $T_{12}$ and $T_{22}$ of a voltage holding section $H_N$ at N-th column, and a first output value $V_{1,m,n}$ outputted from the first pixel data readout section 20.

Further, subsequently, each shown are a feeding operation of a bias potential $V_{bias}$ of each switch $SW_n$, a transmitting operation of an electric charge of each switch $SW_n$, opening/closing of a switch SW of each integrating circuit 31$_n$, opening/closing of a switch $SW_{1,1}$ at 1st column, opening/closing of a switch $SW_{1,N}$ at N-th column, a second voltage value $V_{2,m,n}$ outputted from the second data readout section 30, and a digital value $D_{m,n}$ outputted from the data output section 40.

Before the time $t_{10}$, a discharge control signal $S_{reset,m}$, a transmission control signal $S_{trans}$, and a selection control signal $S_{select,n}$ at n-th row inputted to each pixel section $P_{m,n}$ each are a low level. Also, a first input control signal $S_{input,1}$, a second input control signal $S_{input,2}$, and an output control signal $S_{output,n}$ at n-th column inputted to each voltage holding section $H_n$ of the first pixel data readout section 20 each are a low level.

A readout of data of each pixel section $P_{1,n}$ at 1St row is carried out during the period from the time $t_{10}$ to the time $t_{20}$. At the pixel section $P_{1,n}$, the discharge control signal $S_{reset,m}$ is turned to a high level at the time $t_{10}$, and then turned to a low level at the time $t_{11}$ that is later than the time $t_{10}$. The transmission control signal $S_{trans}$ is turned to a high level at the time $t_{12}$ later than the time $t_{11}$, and turned to a low level at the time $t_{13}$ later than the time $t_{12}$. The selection control signal $S_{select,1}$ at 1st row is turned to a high level at the time $t_{10}$. The switch $SW_n$ supplies the bias potential $V_{bias}$ to each pixel section $P_{m,n}$ during the period from the time $t_{10}$ to the time $t_{11}$.

In each voltage holding section $H_n$ of the first pixel data readout section 20, the first input control signal $S_{input,1}$ is kept at a high level only during a constant period of time that extends from the time $t_{11}$ when the discharge control signal $S_{reset,m}$ is turned to a low level till the time $t_{12}$ turned to a low level. Thus, during this period of time, a voltage value (dark signal component) outputted from the pixel section $P_{1,n}$ to a wiring $L_{1,n}$ is held by the first voltage holding section $H_{n,1}$ of the voltage holding section $H_n$.

Also, in each voltage holding section $H_n$ of the first pixel data readout section 20, the second input control signal $S_{input,2}$ keeps a high level only during a constant period of time from the time $t_{12}$ when the transmission control signal $S_{trans}$ is a high level till the time $t_{13}$. Thus, during this period of time, a voltage value (bright signal component) outputted from the pixel section $P_{1,n}$ to the wiring $L_{1,n}$ is held by the second voltage holding section $H_{n,2}$ of the voltage holding section $H_n$.

Then, during the period from the time $t_{14}$ later than the time $t_{13}$ to the time $t_{15}$, output control signals $S_{output,1}$ to $S_{output,N}$ each are sequentially maintained only during a constant period of time. In a period of time that the output control signal $S_{output,n}$ at n-th column is kept at a high level, the dark signal component and bright signal component of the pixel section $P_{1,n}$ at 1st row and n-th column held in the voltage holding section $H_n$ are outputted from the voltage holding section $H_n$, a difference between these dark signal component and bright signal component is determined by the subtracting circuit S, and a first voltage value $V_{1,1,n}$ corresponding to intensity of light incident on the pixel section $P_{1,n}$ is outputted from the first pixel data readout section 20. Thus, during the period from the time $t_{14}$ to the time $t_{15}$, first voltage values $V_{1,1,1}$ to $V_{1,1,n}$ corresponding to respective intensities of light incident on the N pixel sections $P_{1,1}$ to $P_{1,N}$ at 1st row are sequentially outputted from the first pixel data readout section 20. Note that the level of each voltage value $V_{1,1,n}$ outputted during this period of time is a level corresponding to intensity of light incident on the pixel section $P_{1,n}$, generally different depending on the n value. Thereafter, at the time $t_{15}$, the selection control signal $S_{select,1}$ at 1st row is turned to a low level. In the aforementioned manner, data readout at each pixel section $P_{1,n}$ at 1st row is completed.

Subsequently, during the period from the time $t_{20}$ to the time $t_{30}$, data readout of each pixel section $P_{2,n}$ is carried out. In the pixel section $P_{2,n}$, the discharge control signal $S_{reset,m}$ is turned to a high level at the time $t_{20}$, and turned to a low level at the time $t_{21}$ later than the time $t_{20}$. The transmission control signal $S_{trans}$ is turned to a high level at the time $t_{22}$ later than the time $t_{21}$, and turned to a low level at the time $t_{23}$ later than the time $t_{22}$. The switch $SW_n$ supplies the bias potential $V_{bias}$ to each pixel section $P_{m,n}$ during the period from the time $t_{20}$ to the time $t_{21}$.

In each voltage holding section $H_n$ of the first pixel data readout section 20, the first input control signal $S_{input,1}$ is kept at a high level only during a constant period of time that extends from the time $t_{21}$ when the discharge control signal $S_{reset,m}$ is turned till a high level to the time $t_{22}$ turned to a high level. Thus, during this period of time, the voltage value (dark signal component) outputted from the pixel section $P_{2,n}$ to the wiring $L_{1,n}$ is held by the first voltage holding section $H_{n,1}$ of the voltage holding section $H_n$.

Also, in each voltage holding section $H_n$ of the first pixel data readout section 20, the second input control signal $S_{input,2}$ keeps a high level only during a constant period of time from the time $t_{22}$ when the transmission control signal $S_{trans}$ is a high level till the time $t_{23}$. Thus, during this period of time, a voltage value (bright signal component) outputted from the pixel section $P_{2,n}$ to the wiring $L_{1,n}$ is held by a second voltage holding section $H_{n,2}$ of the voltage holding section $H_n$.

Then, during the period from the time $t_{24}$ later than the time $t_{23}$ to a time $t_{25}$, output control signals $S_{output,1}$ to $S_{output,N}$ each are sequentially maintained only during a constant period of time. In a period of time that the output control signal $S_{output,n}$ at n-th column is kept at a high level, the dark signal component and bright signal component of the pixel section $P_{2,n}$ at 2nd row and n-th column held in the voltage holding section $H_n$ are outputted from the voltage holding section $H_n$, a difference between these dark signal component and bright signal component is determined by the subtracting circuit S, and a first voltage value $V_{1,2,n}$ corresponding to intensity of light incident on the pixel section $P_{2,n}$ is outputted from the first pixel data readout section 20. Thus, during the period from the time $t_{24}$ to the time $t_{25}$, first voltage values $V_{1,2,1}$ to $V_{1,2,N}$ corresponding to respective intensities of light incident on the N pixel sections $P_{2,1}$ to $P_{2,N}$ at 2nd row are sequentially outputted from the first pixel data readout section 20. Note that the level of each voltage value $V_{1,2,n}$ outputted during this period of time is a level corresponding to intensity of light incident on the pixel section $P_{2,n}$, generally different depending on the n value. Thereafter, at the time $t_{25}$, the selection control signal $S_{select,2}$ at 2nd row is turned to a low level. From the above, data readout at each pixel section $P_{2,n}$ at 2nd row is completed.

Hereinafter also, in a like manner, the data of the pixel section $P_{m,n}$ at each row is sequentially read out from the first pixel data readout section 20. In such a way, first voltage values $V_{1,m,1}$ to $V_{1,m,N}$ corresponding to intensities of light incident on the N pixel sections $P_{m,1}$ to $P_{m,N}$ at each row are sequentially outputted from the first pixel data readout section 20. Additionally, in parallel with the readout of the first voltage values $V_{1,m,n}$ according to this first data readout section 20, readout of the second voltage value $V_{2,m,n}$ will be carried out as follows.

The second pixel data readout section 30 operates as follows. During the period from the time $t_{10}$ to the time $t_{11}$, the switch SW of each integrating circuit $31_n$ is closed, and the capacitive element C of each integrating circuit $31_n$ is discharged. In the period from the time $t_{12}$ to the time $t_{13}$ when the transmission control signal $S_{trans}$ is a high level, during a period after the second input control signal $S_{input,2}$ is once turned to a high level and then turned to a low level, the discharge control signal $S_{reset,m}$ is once turned to a high level and then turned to a low level; simultaneously, each of switches $SW_n$ is closed, and the electric charge accumulated in the capacitance section of the pixel section $P_{1,n}$ at 1st row is moved to the capacitive element C of the integrating circuit $31_n$. During the period from the time $t_{14}$ to the time $t_{15}$, each of switches $SW_{1,n}$ is sequentially closed for a constant period of time. During the period when the switches $SW_{1,n}$ are closed, a second voltage value $V_{2,1,n}$ corresponding to the amount of the electric charge accumulated in the capacitive element C of the integrating circuit $31_n$ is outputted from the second pixel data readout section 30. In this way, during the period from the time $t_{14}$ to the time $t_{15}$, second voltage values $V_{2,1,1}$ to $V_{2,1,N}$ corresponding to intensities of light incident on the respective N pixel sections $P_{1,1}$ to $P_{1,N}$ at 1st row are sequentially outputted from the second pixel data readout section 30. From the above, data readout of each pixel section $P_{1,n}$ at 1st row is completed.

Subsequently, during the period from the time $t_{20}$ to the time $t_{21}$, the switch SW of each integrating circuit $31_n$ is closed, and the capacitive element C of each integrating circuit $31_n$ is discharged. In the period from the time $t_{22}$ to the time $t_{23}$ when the transmission control signal $S_{trans}$ is a high level, during the period after the second input control signal $S_{input,2}$ is once turned to a high level, and then turned to a low level, the discharge control signal $S_{reset,m}$ is once turned to a high level, and then turned to a low level; simultaneously, each switch $SW_n$ is closed, and the electric charge accumulated in the capacitance section of the pixel section $P_{2,n}$ at 2nd row is moved to the capacitive element C of the integrating circuit $31_n$. During the period from time $t_{24}$ to time $t_{25}$, each switch $SW_{1,n}$ is sequentially closed for a constant period of time. During the period when the switch $SW_{1,n}$ is closed, a second voltage value $V_{2,2,n}$ corresponding to the amount of the electric charge accumulated in the capacitive element C of the integrating circuit $31_n$ is outputted from the second pixel data readout section 30. In this way, during the period from the time $t_{24}$ to the time $t_{25}$, second voltage values $V_{2,2,1}$ to $V_{2,2,N}$ corresponding to intensities of light incident on the respective N pixel sections $P_{2,1}$ to $P_{2,N}$ at 2nd row are sequentially outputted from the second pixel data readout section 30. From the above, data readout of each pixel section $P_{2,n}$ at 2nd row is completed.

Hereinafter also, in a similar manner, data of the pixel sections $P_{m,n}$ on at each row are read out from the second pixel data readout section 30. Thus, from the second pixel data readout section 30, second voltage values $V_{2,m,1}$ to $V_{2,m,N}$ corresponding to intensities of light incident on respective N pixel sections $P_{m,1}$ to $P_{m,N}$ at each row are sequentially read out with respect to each of 1st row to M-th row.

Then, the data output section 40 operates as follows. During the period from the time $t_{14}$ to the time $t_{15}$, the first voltage value $V_{1,1,n}$ on the pixel section $P_{1,n}$ at 1st row read out from the first pixel data output section 20 is sequentially inputted to the data output section 40, and the second voltage value $V_{2,1,n}$ on the pixel section $P_{1,n}$ at 1st row read out from the second pixel data output section 30 is sequentially inputted to the data output section 40, and then the digital value $D_{1,n}$ that is an A/D converted result of the first voltage value $V_{1,1,n}$ or second voltage value $V_{2,1,n}$ is sequentially outputted from the data output section 40.

Subsequently, during the period of time from the time $t_{24}$ to the time $t_{25}$, the first voltage value $V_{1,2,n}$ on the pixel section $P_{2,n}$ at 2nd row read out from the first pixel data output section 20 is sequentially inputted to the data output section 40, and the second voltage value $V_{2,2,n}$ on the pixel section $P_{2,n}$ at 2nd row read out from the second pixel data output section 30 is sequentially inputted to the data output section 40, and then the digital value $D_{2,n}$ that is an A/D converted result of the first voltage value $V_{1,2,n}$ or second voltage value $V_{2,2,n}$ is sequentially outputted from the data output section 40.

Hereinafter also, in a similar manner, for 1st row to M-th row, digital values $D_{m,1}$ to $D_{m,N}$ corresponding to intensities of light incident on N pixel sections $P_{m,1}$ to $P_{m,N}$ for each row are sequentially outputted from the data output section 40, respectively. At this point, when the parasitic capacitance section of the pixel section $P_{m,n}$ is not saturated, that is, when intensity of incident light to the pixel section $P_{m,n}$ is relatively small, an A/D converted result from the first voltage values $V_{1,m,n}$ is outputted as the digital values $D_{m,n}$. On the other hand, when the parasitic capacitance section of the pixel section $P_{m,n}$ is saturated, that is, when the intensity of incident light to the pixel section $P_{m,n}$ is relatively great, an A/D converted result from the second voltage values $V_{2,m,n}$ is outputted as the digital values $D_{m,n}$. Therefore, the photo-detecting apparatus 1 according to the first embodiment can detect the intensity of incident light with high sensitivity and wide dynamic range.

Here, in the aforementioned operation example, during the period of time when the first pixel data readout section 20 processes an output voltage value from the pixel section $P_{m,n}$ at m-th row, the second pixel data readout section 30 processes the output electric charge from the pixel section $P_{m,n}$ at m-th row. However, during the period of time when the first pixel data readout section 20 processes an output voltage value from the pixel section $P_{m,n}$ at one row, the second pixel data readout section 30 may be set to process the output electric charge from the pixel section at $P_{m,n}$ at another row. For instance, during the period of time when the first pixel data readout section 20 processes an output voltage value from the pixel section $P_{m,n}$ at (m+1)-th row, the second pixel data readout section 30 may be set to process the output electric charge from the pixel section $P_{m,n}$ at m-th row. In any case, when the first pixel data readout section and second pixel data readout section operate in parallel with each other, it is possible to carry out an image pickup without lowering a frame rate. However, in the latter case, the discharge control signal $S_{reset,m}$ at m-th row inputted to the pixel section $P_{m,n}$ at m-th row is individually set, and the first voltage value $V_{1,m,n}$ of the pixel section $P_{m,n}$ at m-th row outputted previously from the first pixel data readout section 20 is stored till the second voltage value $V_{2,m,n}$ of the pixel section $P_{m,n}$ at m-th row is outputted from the second pixel data readout section 30.

Second Embodiment

Figure 12:
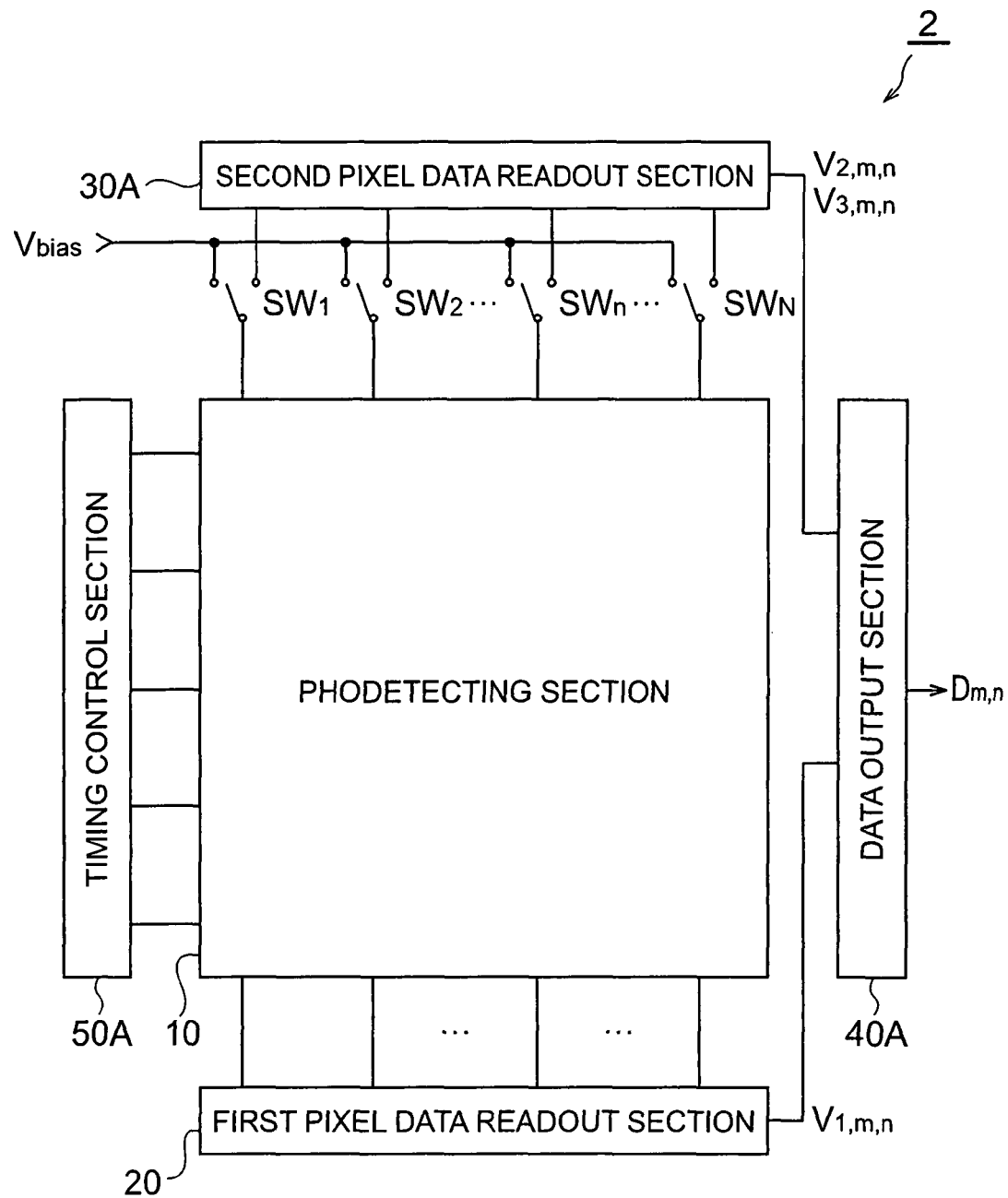
FIG. 12 is a diagram showing a schematic construction of a second embodiment of the photo-detecting apparatus according to the present invention.

A photo-detecting apparatus 2 according to a second embodiment will next be explained. FIG. 12 is schematic diagram of the photo-detecting apparatus 2 according to the second embodiment. As compared to the photo-detecting apparatus 1 according to the already mentioned first embodiment, the photo-detecting apparatus 2 according to the second embodiment is different in the points of: including a second pixel data readout section 30A in place of the second pixel data readout section 30; including a data output section 40A in place of the data output section 40; and including a timing control section 50A in place of the timing control section 50.

In the second embodiment, the second pixel data readout section 30A outputs not only a second voltage value $V_{2,m,n}$ but also a third voltage value $V_{3,m,n}$ to the data output section 40. As stated above, the second voltage value $V_{2,m,n}$ is a value having a linear relationship with respect to the amount of the electric charge generated at the photodiode PD within the pixel section $P_{m,n}$. On the other hand, as stated later, the third voltage value $V_{3,m,n}$ is a value corresponding to a logarithmic value of the amount of the electric charge generated at the photodiode PD within the pixel section $P_{m,n}$ and flown in the second pixel data readout section 30A. The second voltage value $V_{2,m,n}$ and third voltage value $V_{3,m,n}$ outputted from the second pixel data readout section 30A may be outputted at different timings from each other, and inputted to the data output section 40A by way of a common wiring. Additionally, the second voltage value $V_{2,m,n}$ and third voltage value $V_{3,m,n}$ outputted from the second pixel data readout section 30A may be inputted to the data output section 40A by way of different wirings from each other.

Figure 13:
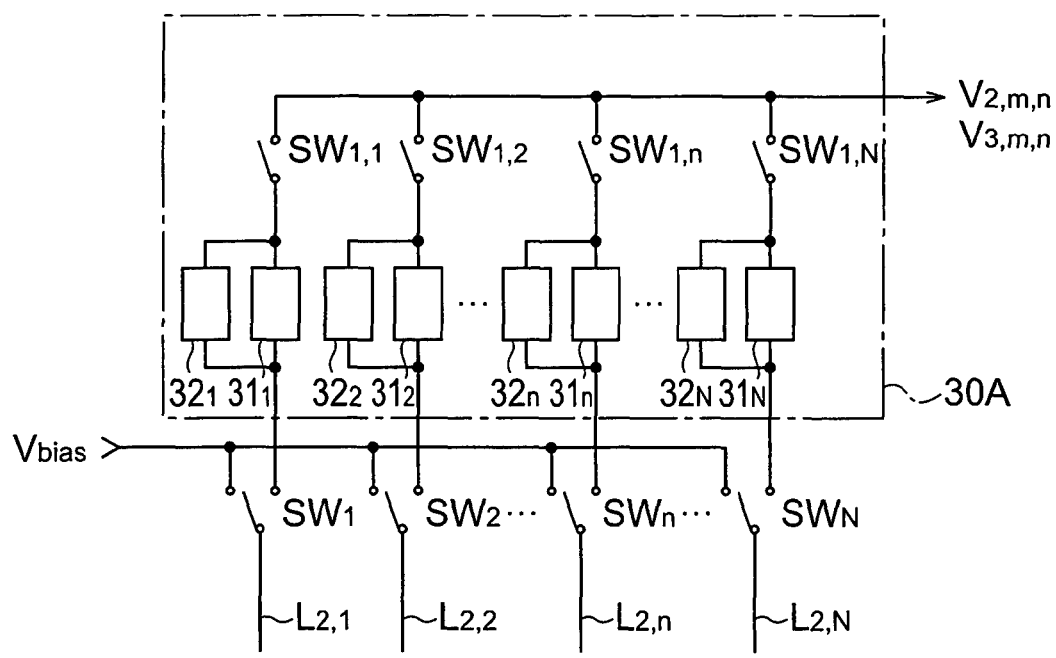
FIG. 13 is a diagram showing a construction of a second pixel data readout section in the photo-detecting apparatus according to the 5 second embodiment.

FIG. 13 is a schematic diagram of the second pixel data readout section 30A of the photo-detecting apparatus 2 according to the second embodiment. As compared to the construction of the second pixel data readout section 30 in the first embodiment shown in FIG. 5, the second pixel data readout section 30A in the second embodiment shown in FIG. 13 is different in the points of including further a logarithmic compressing circuit $32_n$ provided in shunt with respect to an integrating circuit $31_n$.

Figure 14:
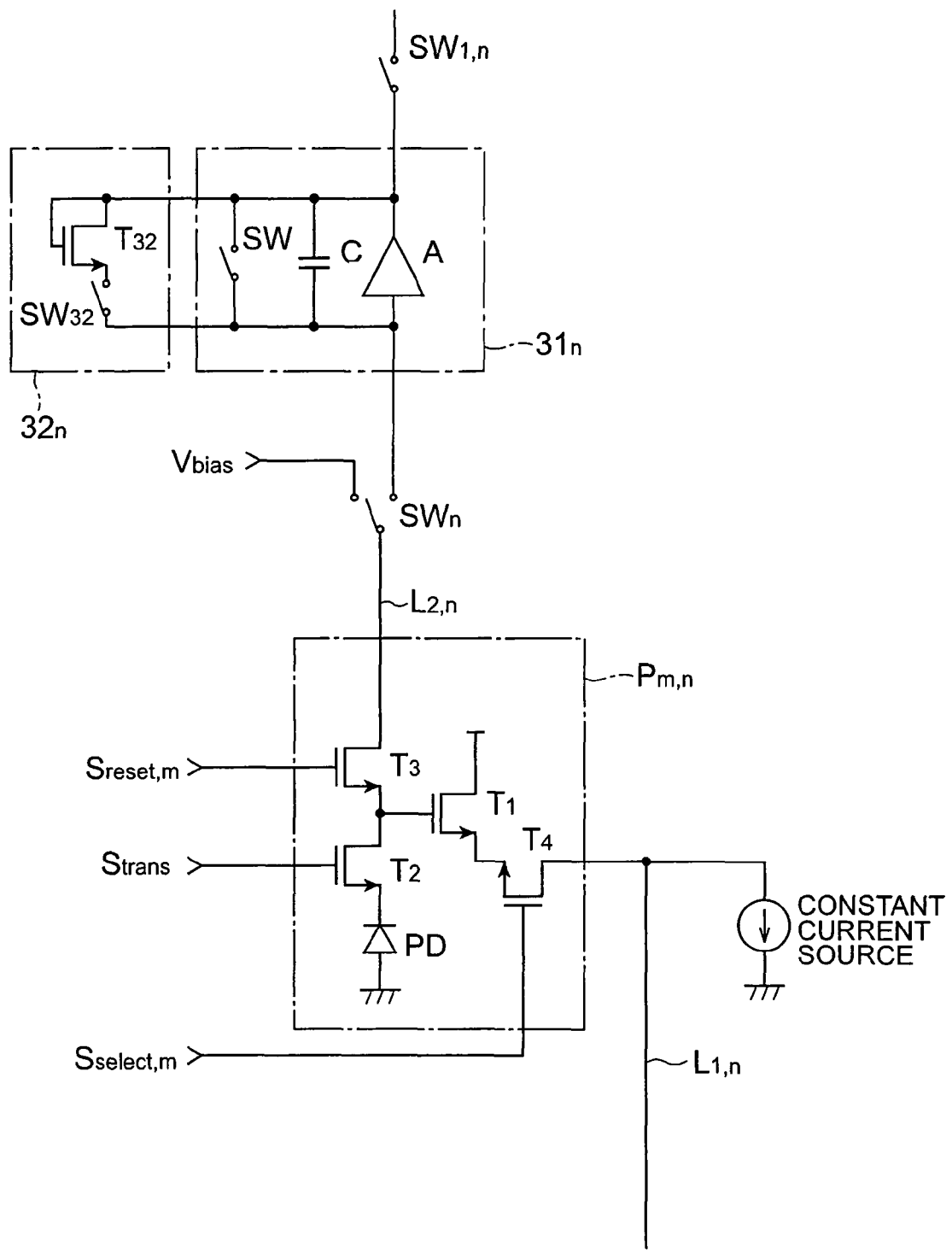
FIG. 14 is a circuit diagram of each of a pixel section $P_{m,n}$, an integrating circuit $31_n$, a logarithmic compressing circuit $32_n$, and a switch $SW_n$ in the photo-detecting apparatus according to the second embodiment.

FIG. 14 is a circuit diagram of each of the pixel section $P_{m,n}$, integrating circuit $31_n$, logarithmic compressing circuit 32, and switch $SW_n$ of the photo-detecting apparatus 2 according to the second embodiment. The logarithmic compressing circuit $32_n$ is provided in parallel with the capacitive element C of the integrating circuit $31_n$. The logarithmic compressing circuit $32_n$ has a transistor $T_{32}$ and a switch $SW_{32}$. The source terminal of the transistor $T_{32}$ is connected to the input terminal of an amplifier A via a switch $SW_{32}$. The drain terminal of the transistor $T_{32}$ is directly connected to the gate of the transistor $T_{32}$, and also connected to the output terminal of the amplifier A. By inputting the electric charge flown from the switch $SW_n$, the logarithmic compressing circuit $32_n$ can output a third voltage value $V_{3,m,n}$ corresponding to a logarithmic value of the inflow of the inputted electric charge.

In this case, assume that a transmission control signal $S_{trans}$ applied to the gate terminal of the transmitting transistor $T_2$ in the pixel section $P_{m,n}$ is a high level, and that a discharge control signal $S_{reset,m}$ at m-th row applied to the gate terminal of the discharging transistor $T_3$ also is a high level; further, assume that the switch $SW_n$ connects a wiring $L_{2,n}$ to the input terminal of the amplifier A, and that the switch SW in the integrating circuit $31_n$ is opened, and that the switch $SW_{32}$ in the logarithmic compressing circuit $32_n$ is closed. At this time, when the inflow (i.e., electric current) of the electric charge flown in the logarithmic compressing circuit $32_n$ with incidence of light to the photodiode PD in the pixel section $P_{m,n}$ is Ish, the third voltage value $V_{3,m,n}$ outputted from the logarithmic compressing circuit $32_n$ is expressed by the following equation (1): where k is the Boltzmann's constant, T is the absolute temperature, q is the charge of electron, and I is a constant, $$V_{3,m,n}=(kT/q)\ln(Ish/I) \qquad (1)$$

As mentioned above, in this embodiment, the second pixel data readout section 30A outputs not only the second voltage value $V_{2,m,n}$ corresponding to the amount of the electric charge generated at the photodiode PD within the pixel section $P_{m,n}$ and accumulated in the capacitive element C, but also the third voltage value $V_{3,m,n}$ corresponding to the logarithmic value of the amount of the electric charge from the logarithmic compressing circuit $32_n$. Also, the second pixel data readout section 30A outputs the second voltage value $V_{2,m,n}$ and third voltage value $V_{3,m,n}$ at timings different from each other to a common wiring leading to the data output section 40A.

The construction of the data output section 40A of the photo-detecting apparatus 2 according to the second embodiment will next be explained with reference to FIGS. 15 and 16.

Figure 15:
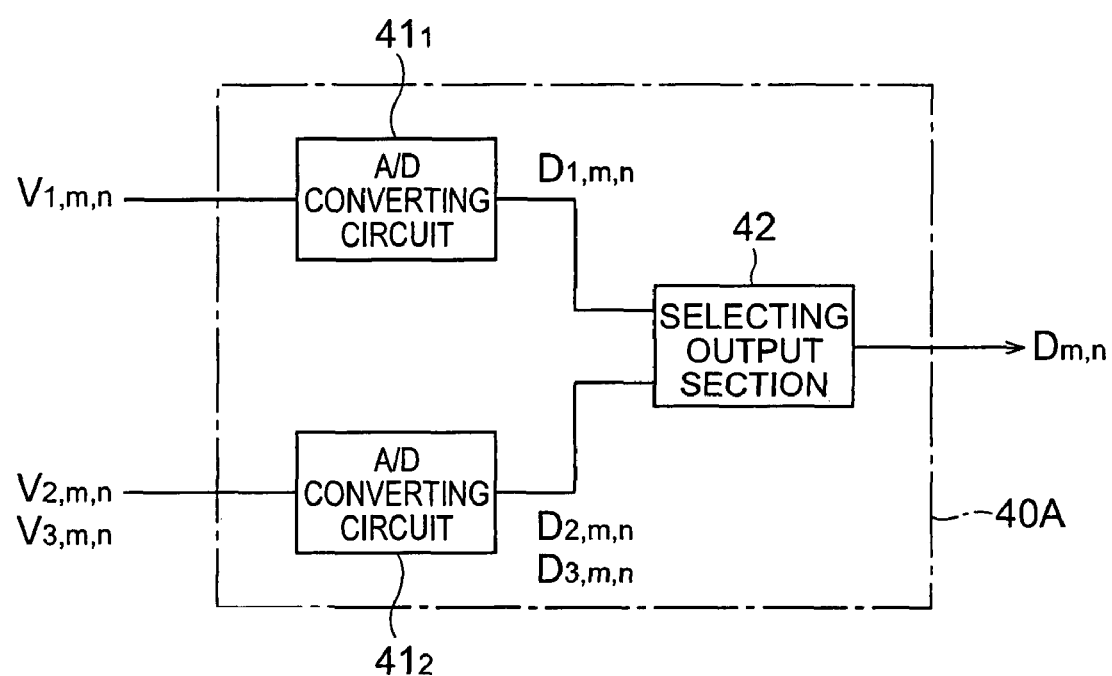
FIG. 15 is a diagram showing one construction example of a data output section in the photo-detecting apparatus according to the second embodiment.

FIG. 15 is a diagram showing one constructional example of the data output section 40A of the photo-detecting apparatus 2 according to the second embodiment. The data output section 40A shown in this drawing has a substantially similar construction to that shown in FIG. 7, and A/D converting circuits $41_1$, $41_2$ and a selecting output section 42. However, in the second embodiment, the A/D converting circuit $41_2$ inputs the second voltage value $V_{2,m,n}$ outputted from the second pixel data readout section 30A to be A/D converted, and outputs the second digital value $D_{2,m,n}$ corresponding to the second voltage value $V_{2,m,n}$ and also inputs the third voltage value $V_{3,m,n}$ outputted from the second pixel data readout section 30A to be A/D converted, and outputs the third digital value $D_{3,m,n}$ corresponding to the third voltage value $V_{3,m,n}$.

The selecting output section 42 inputs these first digital value $D_{1,m,n}$, second digital value $D_{2,m,n}$, and third digital value $D_{3,m,n}$; based on results comparing in magnitude the first digital value $D_{1,m,n}$ and a reference value, any one of the first digital value $D_{1,m,n}$, second digital value $D_{2,m,n}$, and third digital value $D_{3,m,n}$ is selected, and the selected value is outputted as the digital value $D_{m,n}$. However, instead of comparing in magnitude the first digital value $D_{1,m,n}$ and the reference value, the second digital value $D_{2,m,n}$ or third digital value $D_{3,m,n}$ and the reference value may be compared, and any one of the first voltage value $V_{1,m,n}$, second voltage value $V_{2,m,n}$, and third voltage value $V_{3,m,n}$ may be compared in magnitude to the reference value. For the reference value, employed are two of a first reference value enable to determine whether the parasitic capacitance section of the pixel section $P_{m,n}$ is saturated or not, and a second reference value enable to determine whether the capacitive element C of the integrating circuit $31_n$ is saturated or not.

Then, when the parasitic capacitance section of the pixel section $P_{m,n}$ is not saturated, that is, when intensity of incident light to the pixel section $P_{m,n}$ is comparatively small, the first digital value $D_{1,m,n}$ (that is, an A/D converted result of the first voltage value $V_{1,m,n}$ outputted from the selecting transistor $T_4$ of the pixel section $P_{m,n}$ and read out from the first pixel data readout section 20) is outputted from the data output section 40A as the digital value $D_{m,n}$, thereby enabling photodetection with high sensitivity.

On the other hand, when the parasitic capacitance section of the pixel section $P_{m,n}$ is saturated (or when it is a status on the verge of saturation), and when the capacitive element C of the integrating circuit $31_n$ is not saturated, the second digital value $D_{2,m,n}$ (that is, an A/D converted result of the second voltage value $V_{2,m,n}$ outputted from the discharging transistor $T_3$ of the pixel section $P_{m,n}$ and read out from the integrating circuit $31_n$ of the second pixel data readout section 30A) is outputted from the data output section 40A as the digital value $D_{m,n}$, thereby enabling photodetection with wide dynamic range.

Further, when the capacitive element C of the integrating circuit $31_n$ also is saturated (or when it is a status on the verge of saturation), that is, intensity of incident light to the pixel section $P_{m,n}$ is comparatively large, the third digital value $D_{3,m,n}$ (that is, an A/D converted result of the third voltage value $V_{3,m,n}$ outputted from the discharging transistor $T_3$ of the pixel section $P_{m,n}$ and read out from the logarithmic compressing circuit $32_n$ of the second pixel data readout section 30A) is outputted from the data output section 40A as the digital value $D_{m,n}$ thereby enabling photodetection with further wide dynamic range. Therefore, the photo-detecting apparatus 2 according to the second embodiment can carry out an image pickup with high sensitivity and further wide dynamic range.

Figure 16:
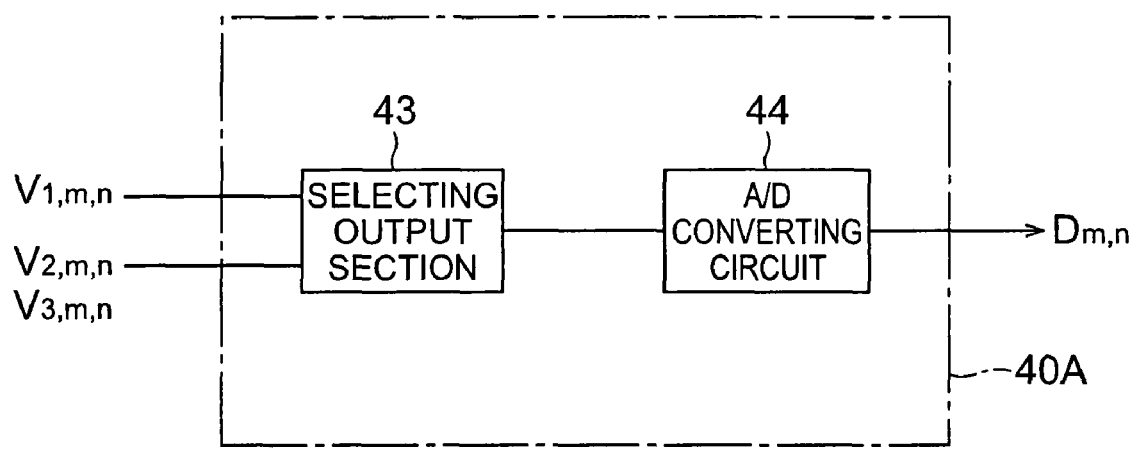
FIG. 16 is a diagram showing another construction example of the data output section in the photo-detecting apparatus according to the second embodiment.

FIG. 16 is a diagram showing another construction example of the data output section 40A of the photo-detecting apparatus 2 according to the second embodiment. The data output section 40A shown in this drawing has a substantially similar construction to that shown in FIG. 8, and a selecting output section 43 and an A/D converting circuit 44. However, in the second embodiment, the selecting output section 43 inputs the first voltage value $V_{1,m,n}$ outputted from the first pixel data readout section 20, and inputs the second voltage value $V_{2,m,n}$ and third voltage value $V_{3,m,n}$ outputted from the second pixel data readout section 30A, and based on results comparing in magnitude the first voltage value $V_{1,m,n}$ and the reference value, selects any one of the first voltage value $V_{1,m,n}$ second voltage value $V_{2,m,n}$ and third voltage value $V_{3,m,n}$ to be outputted. However, instead of comparing in magnitude the first voltage value $V_{1,m,n}$ and the reference value, the second voltage value $V_{2,m,n}$ or third voltage value $V_{3,m,n}$ and the reference value may be compared. For the reference value, employed are two of a first reference value enable to determine whether the parasitic capacitance section of the pixel section $P_{m,n}$ is saturated or not, and of a second reference value enable to determine whether the capacitive element C of the integrating circuit $31_n$ is saturated or not.

Then, when the parasitic capacitance section of the pixel section $P_{m,n}$ is not saturated, that is, when intensity of incident light to the pixel section $P_{m,n}$ is comparatively small, an A/D converted result of the first voltage value $V_{1,m,n}$ outputted from the selecting transistor $T_4$ of the pixel section $P_{m,n}$ and read out from the first pixel data 20 is outputted from the data output section 40A as the digital value $D_{m,n}$, thereby enabling photodetection with high sensitivity.

On the other hand, when the parasitic capacitance section of the pixel section $P_{m,n}$ is saturated (or when it is a status on the verge of saturation), and when the capacitive element C of the integrating circuit $31_n$ is not saturated, an A/D converted result of the second voltage value $V_{2,m,n}$ outputted from the discharging transistor $T_3$ of the pixel section $P_{m,n}$ and read out from the integrating circuit $31_n$ of the second pixel data 30A is outputted from the data output section 40A as the digital value $D_{m,n}$, thereby enabling photodetection with wide dynamic range.

Further, when the capacitive element C of the integrating circuit $31_n$ in also is saturated (or when it is a status on the verge of saturation), that is, when intensity of incident light to the pixel section $P_{m,n}$ is comparatively large, an A/D converted result of the third voltage value $V_{3,m,n}$ outputted from the discharging transistor $T_3$ of the pixel section $P_{m,n}$ and read out from the logarithmic compressing circuit $32_n$ of the second pixel data 30A is outputted from the data output section 40A as the digital value $D_{m,n}$, thereby enabling photodetection with further wide dynamic range. Therefore, the photo-detecting apparatus 2 according to the second embodiment can carry out an image pickup with high sensitivity and further wide dynamic range.

Figure 17:
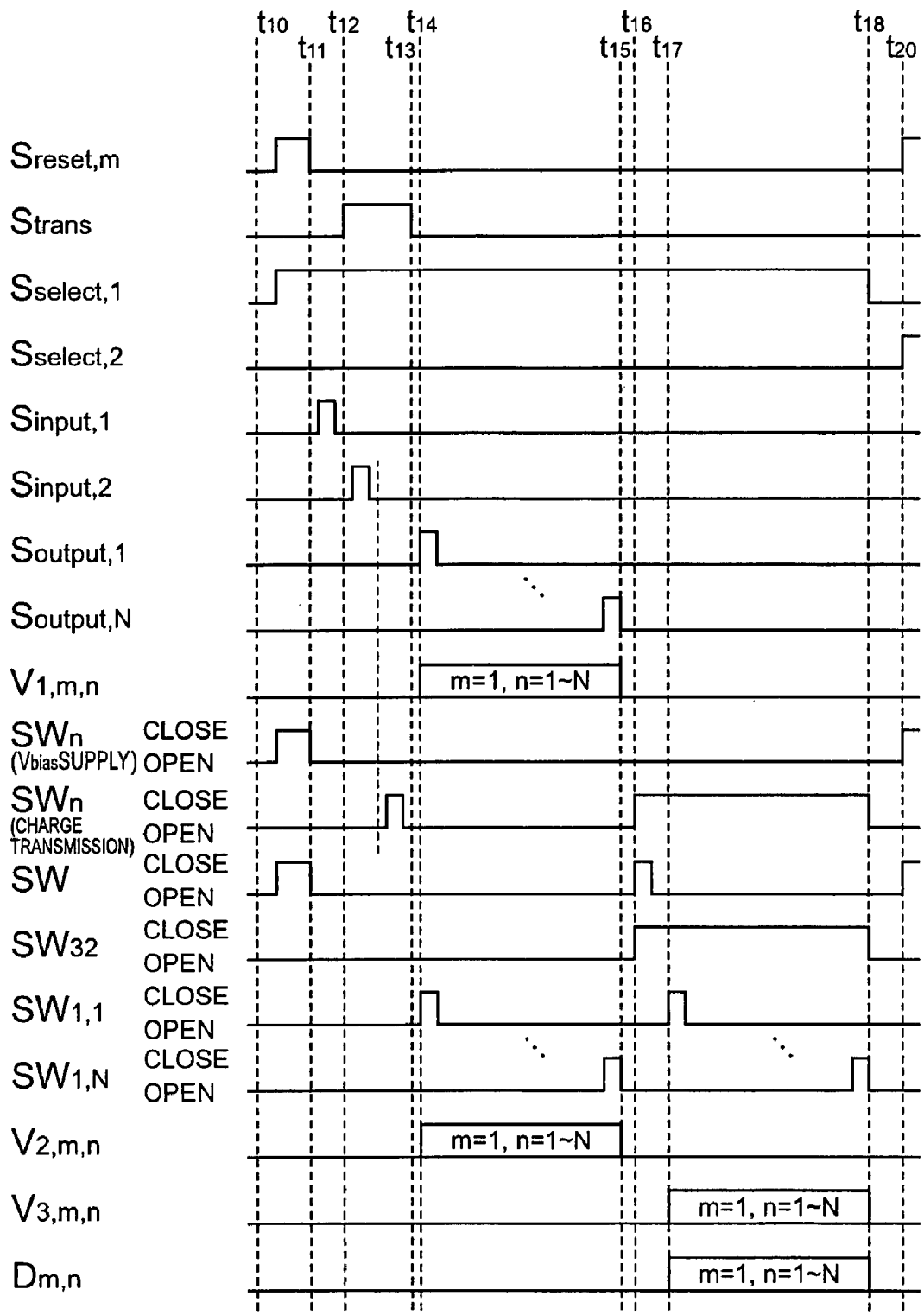
FIG. 17 is a timing chart for explaining an operation example of the photo-detecting apparatus according to the second embodiment.

An example in operation of the photo-detecting apparatus 2 according to the second embodiment will next be explained. FIG. 17 is a timing chart for explaining an operation example of the photo-detecting apparatus 2 according to the second embodiment. This figure shows a range of time for reading out the data of each pixel section $P_{1,n}$ at 1st row. As compared with the timing chart in the case of the first embodiment shown in FIG. 11, in the timing chart in the case of the second embodiment shown in FIG. 17, subsequently to opening/closing of the switch SW of each integrating circuit $31_n$, opening/closing of the switch $SW_{32}$ of each logarithmic compressing circuit $32_n$, opening/closing of the switch $SW_{1,1}$ at 1st column, opening/closing of the switch $SW_{1,N}$ at N-th column, a second voltage value $V_{2,m,n}$ outputted from the second data readout section 30A, a third voltage value $V_{3,m,n}$ outputted from the second data readout section 30A, and a digital value $D_{m,n}$ outputted from the data output section 40A each are shown in this turn. Additionally, while the second voltage value $V_{2,m,n}$ and third voltage value $V_{3,m,n}$ are shown at different timings from each other in this timing chart, they are outputted to a common wiring connected to the switch $SW_{1,n}$ at different timings from each other.

The operation of the photo-detecting apparatus 2 according to the second embodiment from the time $t_{10}$ or before to the time $t_{15}$ is similar to that of the first embodiment. Note that the switch $SW_{32}$ of each logarithmic compressing circuit $32_n$ is opened in this period of time.

During the period from the time $t_{16}$ later than the time $t_{15}$ to the later time $t_{17}$, the switch SW of each integrating circuit $31_n$ is closed for a given period of time, and the capacitive element C of each integrating circuit $31_n$ is discharged. During the period from the time $t_{16}$ to the time $t_{18}$ later than the time $t_{17}$, the switch $SW_{32}$ of each logarithmic compressing circuit $32_n$ is closed; the discharge control signal $S_{reset,m}$ and transmission control signal $S_{trans}$ is turned to a high level, and simultaneously each switch $SW_n$ is closed, and the electric charge generated at the photodiode PD is flown in each logarithmic compressing circuit $32_n$. In addition, during the period from the time $t_{17}$ to the time $t_{18}$, each switch $SW_{1,n}$ is sequentially closed for a given period of time. For the period of time when the switch $SW_{1,n}$ is closed, the third voltage value $V_{3,1,n}$ corresponding to the logarithmic value of the amount of the electric charge flown in the logarithmic compressing circuit $32_n$ is outputted from the second pixel data readout section 30A. In such a way, during the period from the time $t_{17}$ to the time $t_{18}$, the third voltage values $V_{3,1,1}$ to $V_{3,1,N}$ corresponding to the logarithmic values of the intensities of light incident on respective N pixel sections $P_{1,1}$ to $P_{1,N}$ at 1st row are sequentially outputted from the second pixel data readout section 30A.

Then, in the data readout section 40A, based on the first voltage values $V_{1,1,1}$ to $V_{1,1,N}$ outputted from the first pixel data readout section 20 during the period from the time $t_{14}$ to the time $t_{15}$, the second voltage values $V_{2,1,1}$ to $V_{2,1,N}$ outputted from the second pixel data readout section 30A during the period from the time $t_{14}$ to the time $t_{15}$, and the third voltage values $V_{3,1,1}$ to $V_{3,1,N}$ outputted from the second pixel data readout section 30A during the period from the time $t_{17}$ to the time $t_{18}$, the digital value $D_{1,n}$ that is a result in which any one of the first voltage value $V_{1,1,n}$ second voltage value $V_{2,1,n}$, and third voltage value $V_{3,1,n}$ is A/D converted is sequentially outputted from the data output section 40A. Note that since the timing where the third voltage value $V_{3,1,n}$ is outputted is later than that where the first voltage value $V_{1,1,n}$ and second voltage value $V_{2,1,n}$ are outputted, the data holding section for holding the first voltage value $V_{1,1,n}$ and second voltage value $V_{2,1,n}$ (or these A/D converted results) outputted in advance is provided.

Hereinafter also, in a like manner, for each of 1st row to M-th row, digital values $D_{m,1}$ to $D_{m,N}$ corresponding to the intensities of light incident on respective N pixel sections $P_{m,1}$ to $P_{m,N}$ at each row are sequentially outputted from the data output section 40A. In this case, when the parasitic capacitance section of the pixel section $P_{m,n}$ is not saturated, that is, when the intensity of incident light on the pixel section $P_{m,n}$ is comparatively small, an A/D converted result of the first voltage value $V_{1,m,n}$ is outputted as the digital value $D_{m,n}$. In addition, when the parasitic capacitance section of the pixel section $P_{m,n}$ is saturated, and the capacitive element of the integrating circuit $31_n$ is not saturated, an A/D converted result of the second voltage value $V_{2,m,n}$ is outputted as the digital value $D_{m,n}$. Further, when the capacitive element of the integrating circuit $31_n$ is saturated, that is, when the intensity of incident light on the pixel section $P_{m,n}$ is comparatively large, an A/D converted result of the third voltage value $V_{3,m,n}$ is outputted as the digital value $D_{m,n}$. Therefore, the photo-detecting apparatus 2 according to the second embodiment can detect the intensity of incident light with high sensitivity and wide dynamic range.

The invention claimed is:

1. A photo-detecting apparatus comprising:
a pixel section including a photodiode for generating electric charge of the amount corresponding to intensity of incident light, an amplifying transistor for outputting a voltage value corresponding to the amount of the electric charge accumulated in a parasitic capacitance section formed at its gate terminal, a transmitting transistor for transmitting the electric charge generated at said photodiode to the gate terminal of said amplifying transistor, a discharging transistor for initializing the electric charge of said parasitic capacitance section, and a selecting transistor for outputting selectively the voltage value outputted from said amplifying transistor;
a first pixel data readout section for reading out the voltage value outputted from said selecting transistor of said pixel section and outputting a first voltage value corresponding to this voltage value;
a connection switching section, having a first terminal connected to said discharging transistor of said pixel section, a second terminal for inputting a bias potential for initializing the electric charge of the gate terminal of the amplifying transistor in said pixel section, and a third terminal, for making an electrical connection between said first terminal and said second terminal, or between said first terminal and said third terminal; and
a second pixel data readout section, of which the input terminal is connected to said third terminal of said connection switching section, and which includes a capacitive element having a larger capacitance value than that of said parasitic capacitance section, for accumulating the electric charge flown from said third terminal of said connection switching section to said input terminal in said capacitive element, and outputting a second voltage value corresponding to the amount of the accumulated electric charge.

2. A photo-detecting apparatus comprising:
a pixel section including: a photodiode for generating an electric charge of the amount corresponding to intensity of incident light; a transmitting transistor having a gate terminal for inputting a transmission control signal, a first terminal connected to said photodiode, and a second terminal; a discharging transistor having a gate terminal for inputting a discharge control signal, a first terminal connected to the second terminal of said transmitting transistor, and a second terminal; an amplifying transistor having a gate terminal connected to the second terminal of said transmitting transistor and the first terminal of said discharging transistor respectively, a first terminal set to a given potential, and a second terminal; and a selecting transistor having a gate terminal for inputting a selection control signal, a first terminal connected to the second terminal of said amplifying transistor, and a second terminal;
a first pixel data readout section having an input terminal connected to the second terminal of said selecting transistor in said pixel section;
a connection switching section, having a first terminal connected to the second terminal of said discharging transistor in said pixel section, a second terminal set to a given bias potential, and a third terminal, for making an electrical connection at any one of between said first terminal and said second terminal, and between said first terminal and said third terminal; and
a second pixel data readout section including an input terminal connected to the third terminal of said connection switching section, and a capacitive element for accumulating an electric charge flown in by way of the input terminal.

3. A photo-detecting apparatus according to claim 1, wherein the capacitance value of said capacitive element included in said second pixel data readout section is $2^K$ times as large as that of said parasitic capacitance section, where K is an integer of 1 or more.

4. A photo-detecting apparatus according to claim 1, wherein said photodiode included in said pixel section is provided on a first semiconductor region of a first conduction-type, a second semiconductor region of a second conduction-type provided on said first semiconductor region, and establishing a pn junction between the first and second semiconductor regions, and a third semiconductor region of the first conduction-type provided on said second semiconductor region, and establishing the pn junction between the third and second semiconductor regions.

5. A photo-detecting apparatus according to claim 1, wherein said pixel section further includes an interrupting transistor that is arranged between said photodiode and said transmitting transistor, and that has a gate terminal set to a given potential, a first terminal connected to said photodiode, and a second terminal connected to the first terminal of said transmitting transistor.

6. A photo-detecting apparatus according to claim 1, further comprising a plurality of pixel sections each having the same structure as that of said pixel section, and constructing a two-dimensional arrangement with the pixel section.

7. A photo-detecting apparatus according to claim 6, wherein said second pixel data readout section has a plurality of capacitive elements provided corresponding to each column of the two-dimensionally arranged pixel section as said capacitive element.

8. A photo-detecting apparatus according to claim 6, wherein during the period when said first pixel data readout section processes a voltage value outputted from a group of pixel sections belonging to one row among said pixel sections two-dimensionally arranged, said second pixel data readout section processes the electric charge outputted from the group of pixel sections belonging to said row.

9. A photo-detecting apparatus according to claim 6, wherein during the period when said first pixel data readout section processes a voltage value outputted from a group of pixel sections belonging to one row among said pixel sections two-dimensionally arranged, said second pixel data readout section processes the electric charge outputted from the group of pixel sections belonging to another row.

10. A photo-detecting apparatus according to claim 1, further comprising an A/D converting section for outputting a first digital value corresponding to the first voltage value by A/D converting the first voltage value outputted from said first pixel data readout section, and for outputting a second digital value corresponding to the second voltage value by A/D converting the second voltage value outputted from said second pixel data readout section.

11. A photo-detecting apparatus according to claim 10, further comprising a selecting output section for inputting a first digital value and a second digital value outputted from said A/D converting section, and for outputting either of said first digital value and said second digital value, based on a result where any one of said first voltage value, said second voltage value, said first digital value and said second digital value is compared in magnitude to a reference value.

12. A photo-detecting apparatus according to claim 1, further comprising an A/D converting section for inputting a first voltage value outputted from said first pixel data readout section and a second voltage value outputted from said second pixel data readout section, and for outputting either of said first voltage value and said second voltage value, based on a result where either of said first voltage value and said second voltage value is compared in magnitude to a reference value.

13. A photo-detecting apparatus according to claim 12, further comprising an A/D converting section for outputting a digital value corresponding to the voltage value by A/D converting the voltage value outputted from said selecting output section.

14. A photo-detecting apparatus according to claim 1, wherein said second pixel data readout section includes a logarithmic compressing circuit, arranged in parallel to said capacitive element, for outputting a third voltage value corresponding to a logarithmic value of the amount of in-flow electric charge from said third end of said connection switching section.

15. A photo-detecting apparatus according to claim 14, further comprising an A/D converting section for outputting a first digital value corresponding to the first voltage value by A/D converting the first voltage value outputted from said first pixel data readout section, and for outputting a second digital value corresponding to the second voltage value and a third digital value corresponding to the third voltage value by A/D converting the second voltage value and third voltage value outputted from said second pixel data readout section.

16. A photo-detecting apparatus according to claim 15, further comprising a selecting output section for inputting a first digital value, a second digital value, and a third digital value outputted from said A/D converting section, and for outputting any one of said first digital value, said second digital value, and said third digital value, based on a result where any one of said first voltage value, said second voltage value, said third voltage value, said first digital value, said second digital value, and said third digital value is compared in magnitude to a reference value.

17. A photo-detecting apparatus according to claim 14, further comprising a selecting output section for inputting a first digital value outputted from said first pixel data readout section, and a second voltage value and a third voltage value outputted from said second pixel data readout section, and for outputting any one of said first voltage value, said second voltage value, and said third voltage value, based on a result where any one of said first voltage value, said second voltage value, and said third voltage value is compared in magnitude to a reference value.

18. A photo-detecting apparatus according to claim 17, further comprising an A/D converting section for outputting a digital value corresponding to the voltage value by AM converting the voltage value outputted from said selecting output section.

19. A photodetecting apparatus according to claim 2, wherein said photodiode included in said pixel section is provided on a first semiconductor region of a first conduction-type, a second semiconductor region of a second conduction-type provided on said first semiconductor region, and establishing a pn junction between the first and second semiconductor regions, and a third semiconductor region of the first conduction-type provided on said second semiconductor region, and establishing the pn junction between the third and second semiconductor regions.

20. A photodetecting apparatus according to claim 2, wherein said pixel section further includes an interrupting transistor that is arranged between said photodiode and said transmitting transistor, and that has a gate terminal set to a given potential, a first terminal connected to said photodiode, and a second terminal connected to the first terminal of said transmitting transistor.

21. A photodetecting apparatus according to claim 2, further comprising a plurality of pixel sections each having the same structure as that of said pixel section, and constructing a two-dimensional arrangement with the pixel section.

22. A photodetecting apparatus according to claim 21, wherein said second pixel data readout section has a plurality of capacitive elements provided corresponding to each column of the two-dimensionally arranged pixel section as said capacitive element.

23. A photodetecting apparatus according to claim 21, wherein during the period when said first pixel data readout section processes a voltage value outputted from a group of pixel sections belonging to one row among said pixel sections two-dimensionally arranged, said second pixel data readout section processes the electric charge outputted from the group of pixel sections belonging to said row.

24. A photodetecting apparatus according to claim 21, wherein during the period when said first pixel data readout section processes a voltage value outputted from a group of pixel sections belonging to one row among said pixel sections two-dimensionally arranged, said second pixel data readout section processes the electric charge outputted from the group of pixel sections belonging to another row.

25. A photodetecting apparatus according to claim 2, further comprising an A/D converting section for outputting a first digital value corresponding to the first voltage value by A/D converting the first voltage value outputted from said first pixel data readout section, and for outputting a second digital value corresponding to the second voltage value by A/D converting the second voltage value outputted from said second pixel data readout section.

26. A photodetecting apparatus according to claim 25, further comprising a selecting output section for inputting a first digital value and a second digital value outputted from said A/D converting section, and for outputting either of said first digital value and said second digital value, based on a result where any one of said first voltage value, said second voltage value, said first digital value and said second digital value is compared in magnitude to a reference value.

27. A photodetecting apparatus according to claim 2, further comprising an A/D converting section for inputting a first voltage value outputted from said first pixel data readout section and a second voltage value outputted from said second pixel data readout section, and for outputting either of said first voltage value and said second voltage value, based on a result where either of said first voltage value and said second voltage value is compared in magnitude to a reference value.

28. A photodetecting apparatus according to according to claim 27, further comprising an A/D converting section for outputting a digital value corresponding to the voltage value by A/D converting the voltage value outputted from said selecting output section.

29. A photodetecting apparatus according to claim 2, wherein said second pixel data readout section includes a logarithmic compressing circuit, arranged in parallel to said capacitive element, for outputting a third voltage value corresponding to a logarithmic value of the amount of in-flow electric charge from said third end of said connection switching section.

30. A photodetecting apparatus according to claim 29, further comprising an A/D converting section for outputting a first digital value corresponding to the first voltage value by A/D converting the first voltage value outputted from said first pixel data readout section, and for outputting a second digital value corresponding to the second voltage value and a third digital value corresponding to the third voltage value by A/D converting the second voltage value and third voltage value outputted from said second pixel data readout section.

31. A photodetecting apparatus according to claim 30, further comprising a selecting output section for inputting a first digital value, a second digital value, and a third digital value outputted from said A/D converting section, and for outputting any one of said first digital value, said second digital value, and said third digital value, based on a result where any one of said first voltage value, said second voltage value, said third voltage value, said first digital value, said second digital value, and said third digital value is compared in magnitude to a reference value.

32. A photodetecting apparatus according to claim 29, further comprising a selecting output section for inputting a first digital value outputted from said first pixel data readout section, and a second voltage value and a third voltage value outputted from said second pixel data readout section, and for outputting any one of said first voltage value, said second voltage value, and said third voltage value, based on a result where any one of said first voltage value, said second voltage value, and said third voltage value is compared in magnitude to a reference value.

33. A photodetecting apparatus according to claim 32, further comprising an A/D converting section for outputting a digital value corresponding to the voltage value by A/D converting the voltage value outputted from said selecting output section.

* * * * *